United States Patent
Tokunaga et al.

(10) Patent No.: US 10,871,712 B2
(45) Date of Patent: Dec. 22, 2020

(54) STEPPED SUBSTRATE-COATING COMPOSITION CONTAINING POLYETHER RESIN HAVING PHOTOCROSSLINKABLE GROUP

(71) Applicant: NISSAN CHEMICAL CORPORATION, Tokyo (JP)

(72) Inventors: Hikaru Tokunaga, Toyama (JP); Takafumi Endo, Toyama (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/500,626

(22) PCT Filed: Mar. 30, 2018

(86) PCT No.: PCT/JP2018/013894
§ 371 (c)(1),
(2) Date: Oct. 3, 2019

(87) PCT Pub. No.: WO2018/186310
PCT Pub. Date: Oct. 11, 2018

(65) Prior Publication Data
US 2020/0301278 A1    Sep. 24, 2020

(30) Foreign Application Priority Data
Apr. 3, 2017 (JP) ................. 2017-074044

(51) Int. Cl.
| | | |
|---|---|---|
| *H01L 21/027* | (2006.01) | |
| *G03F 7/11* | (2006.01) | |
| *C08G 65/40* | (2006.01) | |
| *C09D 171/12* | (2006.01) | |
| *G03F 7/16* | (2006.01) | |
| *G03F 7/20* | (2006.01) | |
| *G03F 7/26* | (2006.01) | |

(Continued)

(52) U.S. Cl.
CPC ............ *G03F 7/11* (2013.01); *C08G 65/4043* (2013.01); *C09D 171/12* (2013.01); *G03F 7/162* (2013.01); *G03F 7/168* (2013.01); *G03F 7/2037* (2013.01); *G03F 7/26* (2013.01); *H01L 21/0274* (2013.01); *H01L 21/0332* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 2004/0048196 A1 | 3/2004 | Shao et al. | |
| 2013/0302990 A1* | 11/2013 | Watanabe | G03F 7/094 438/703 |

(Continued)

FOREIGN PATENT DOCUMENTS

| | | |
|---|---|---|
| JP | 2004-533637 A | 11/2004 |
| WO | 2006/115044 A1 | 11/2006 |

(Continued)

OTHER PUBLICATIONS

Jun. 19, 2018 Search Report issued in International Patent Application No. PCT/JP2018/013894.

(Continued)

*Primary Examiner* — Ali Naraghi
(74) *Attorney, Agent, or Firm* — Oliff PLC

(57) ABSTRACT

A stepped substrate-coating composition having high properties of filling a pattern and capable of forming on a substrate a coating film that can be formed by photocuring, has flattening properties, and has high heat resistance after irradiation with light. A photocurable composition for coating a stepped substrate, the photocurable composition containing a polymer containing a unit structure of Formula (1):

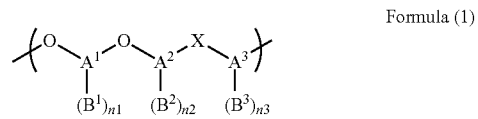

Formula (1)

wherein $A^1$, $A^2$, and $A^3$ are each independently an aromatic $C_{6-100}$ ring optionally containing a heteroatom or a hydrocarbon group containing an aromatic $C_{6-100}$ ring optionally containing a heteroatom, $B^1$, $B^2$, and $B^3$ are each independently Formula (2):

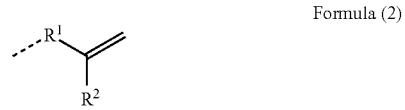

Formula (2)

wherein $R^1$ is a $C_{1-10}$ alkylene group, a $C_{1-10}$ alkenylene group, a $C_{1-10}$ alkynylene group, a $C_{6-40}$ arylene group, an oxygen atom, a carbonyl group, a sulfur atom, —C(O)—O—, —C(O)—$NR^a$—, —$NR^b$—, or a group including a combination thereof, $R^2$ is a hydrogen atom or a $C_{1-10}$ alkyl group.

16 Claims, No Drawings

(51) Int. Cl.
    *H01L 21/033*     (2006.01)
    *H01L 21/308*     (2006.01)

(56) References Cited

U.S. PATENT DOCUMENTS

| | | | | |
|---|---|---|---|---|
| 2015/0185613 | A1* | 7/2015 | Toyokawa | C08G 8/20 |
| | | | | 438/704 |
| 2015/0212418 | A1* | 7/2015 | Nishimaki | G03F 7/094 |
| | | | | 438/703 |
| 2017/0154782 | A1* | 6/2017 | Nakafuji | H01L 21/3081 |
| 2018/0208703 | A1* | 7/2018 | Okada | G03F 7/38 |
| 2019/0225731 | A1* | 7/2019 | Hashimoto | G03F 7/11 |

FOREIGN PATENT DOCUMENTS

| | | |
|---|---|---|
| WO | 2007/066597 A1 | 6/2007 |
| WO | 2008/047638 A1 | 4/2008 |
| WO | 2009/008446 A1 | 1/2009 |
| WO | 2012/050064 A1 | 4/2012 |
| WO | 2013/080929 A1 | 6/2013 |
| WO | 2014/109186 A1 | 7/2014 |
| WO | 2016/159358 A1 | 10/2016 |
| WO | 2016/208518 A1 | 12/2016 |

OTHER PUBLICATIONS

Jun. 19, 2018 Written Opinion of the International Searching Authority issued in International Patent Application No. PCT/JP2018/013894.

\* cited by examiner

STEPPED SUBSTRATE-COATING COMPOSITION CONTAINING POLYETHER RESIN HAVING PHOTOCROSSLINKABLE GROUP

TECHNICAL FIELD

The present invention relates to a stepped substrate-coating composition for forming a flattening film on a stepped substrate by photocrosslinking, and a method for manufacturing a layered substrate that is flattened using the stepped substrate-coating composition.

BACKGROUND ART

In recent years, a semiconductor integrated circuit device has been processed to achieve a fine design rule. In order to form a finer resist pattern by an optical lithography technique, a decrease in wavelength of exposure light is required.

However, the depth of focus is decreased with the decrease in wavelength of exposure light. Therefore, it is necessary to improve flattening property of a coating film formed on a substrate. In order to manufacture a semiconductor device with a finer design rule, a technique of flattening a substrate is important.

A method for forming a flattening film, for example, a resist underlayer film that is formed under a resist by photocuring is disclosed.

A resist underlayer film-forming composition containing a polymer having an epoxy group and an oxetane group in a side chain and a photo-cationic polymerization initiator or a resist underlayer film-forming composition containing a polymer having a radical polymerizable ethylenically unsaturated bond and a photo-radical polymerization initiator is disclosed (see Patent Document 1).

A resist underlayer film-forming composition containing a silicon-containing compound having a cationic polymerizable reactive group such as an epoxy group or a vinyl group, a photo-cationic polymerization initiator, and a photo-radical polymerization initiator is disclosed (see Patent Document 2).

A method for producing a semiconductor device using a resist underlayer film containing a polymer having a crosslinkable functional group (e.g., hydroxyl group) in a side chain, a crosslinker, and a photoacid generator is disclosed (see Patent Document 3).

A resist underlayer film having an unsaturated bond in a main chain or a side chain, which is not a photocrosslinkable resist underlayer film, is disclosed (see Patent Documents 4 and 5).

PRIOR ART DOCUMENTS

Patent Documents

Patent Document 1: International publication WO 2006/115044
Patent Document 2: International publication WO 2007/066597
Patent Document 3: International publication WO 2008/047638
Patent Document 4: International publication WO 2009/008446
Patent Document 5: Japanese Patent Application Publication No. 2004-533637 (JP 2004-533637 A)

SUMMARY OF THE INVENTION

Problem to be Solved by the Invention

A conventional photocrosslinking material has a problem about filling a pattern. This is because during heating for filling a pattern (e.g., a hole or a trench structure) formed on a substrate with a resist underlayer film-forming composition containing a polymer having a thermal crosslinking-forming functional group such as a hydroxyl group, a crosslinker, and an acid catalyst (acid generator), a crosslinking reaction proceeds to increase the viscosity. Since heat shrinkage due to degassing occurs, the conventional photocrosslinking material has a problem about flattening.

A resist underlayer film-forming composition containing a polymer having a cationic polymerizable reactive group such as an epoxy group or a vinyl group and an acid generator is subjected to irradiation with light and heating. In this case, heat shrinkage due to degassing occurs, and therefore the composition has a problem about flattening.

As a photocurable composition for coating a stepped substrate of the present invention of the present application, a stepped substrate-coating composition having high properties of filling a pattern and capable of forming on a substrate a coating film that can be formed by photocuring without occurrence of degassing and heat shrinkage, has flattening properties, and has high heat resistance after irradiation with light is provided.

Means for Solving the Problems

A first aspect of the present invention is a photocurable composition for coating a stepped substrate containing a polymer having a unit structure of Formula (1):

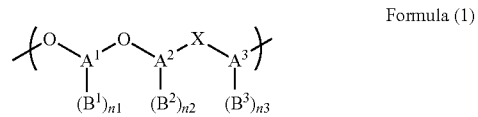

Formula (1)

[wherein $A^1$, $A^2$, and $A^3$ are each independently an aromatic $C_{6-100}$ ring optionally containing a heteroatom or a hydrocarbon group containing an aromatic $C_{6-100}$ ring optionally containing a heteroatom, $B^1$, $B^2$, and $B^3$ are each independently Formula (2):

Formula (2)

(wherein $R^1$ is a $C_{1-10}$ alkylene group, a $C_{1-10}$ alkenylene group, a $C_{1-10}$ alkynylene group, a $C_{6-40}$ arylene group (the alkylene group, the alkenylene group, the alkynylene group, and the arylene group are optionally substituted with one or two or more cyano groups and/or one or two or more hydroxyl groups), an oxygen atom, a carbonyl group, a sulfur atom, —C(O)—O—, —C(O)—NR$^a$—, —NR$^b$—, or a group including a combination thereof, R$^a$ is a hydrogen atom or a $C_{1-10}$ alkyl group, R$^b$ is a hydrogen atom, a $C_{1-10}$ alkyl group, or a $C_{2-10}$ alkylcarbonyl group, R$^2$ is a hydrogen atom or a $C_{1-10}$ alkyl group, and a dotted line is a bond with $A^1$, $A^2$, or $A^3$), X is a carbonyl group, a sulfonyl group, a —CR$^2_2$— group, or a —C(CF$_3$)$_2$— group, n1 is an integer of 1 or more and 4 or less, n2 is an integer of 0 or more and 4 or less, n3 is an integer of 0 or more and 4 or less, and n1+n2+n3 is an integer of 1 to 12].

A second aspect of the present invention is the photocurable composition for coating a stepped substrate according to the first aspect, wherein A$^1$ is a polynuclear phenol of Formula (1-1) or (1-2):

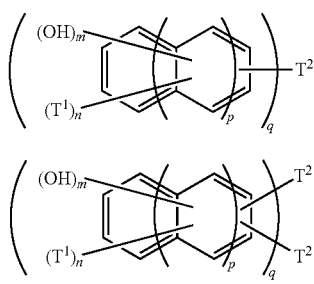

Formula (1-1)

Formula (1-2)

(in Formulae (1-1) and (1-2), T$^1$s are each independently a halogen group, a C$_{1-10}$ alkyl group, a C$_{6-18}$ aryl group, a C$_{7-28}$ arylalkyl group, a C$_{2-10}$ alkylcarbonyl group, a C$_{2-10}$ alkylcarbonyloxy group, a C$_{2-10}$ alkylcarbonylamino group, a C$_{7-28}$ aryloxyalkyl group, a C$_{1-6}$ alkoxy group, or an organic group including a combination thereof, q is an integer of 2 to 6, when q is 2, T$^2$ is a single bond or a divalent C$_{1-10}$ hydrocarbon group optionally having a hydroxyl group or a divalent C$_{7-28}$ arylalkyl group optionally having a hydroxyl group, or when q is 3 to 6, T$^2$ is a trivalent to hexavalent C$_{1-10}$ hydrocarbon group optionally having a hydroxyl group or a trivalent to hexavalent C$_{7-28}$ arylalkyl group optionally having a hydroxyl group, m is an integer of 1 to 7, n is an integer of 0 or more and 7-m or less, two T$^2$s in Formula (1-2) optionally form a ring together, and p is an integer of 0 or 1), in which two hydroxyl groups among m×q hydroxyl groups are replaced by two bonds between A$^1$ and two O atoms, and the rest of the m×q hydroxyl groups and/or a hydrogen atom in T$^2$ are replaced by bonds between A$^1$ and B$^1$, provided that the total number of the bonds with B$^1$ is n1.

A third aspect of the present invention is the photocurable composition for coating a stepped substrate according to the first aspect, wherein A$^1$ is a group derived from tri(hydroxyphenyl)methane, a group derived from tetrakis(hydroxyphenyl)ethane, or a group derived from tetrakis(hydroxyphenyl)-p-xylene, and A$^2$ and A$^3$ are a group derived from a benzene ring or a naphthalene ring.

A fourth aspect of the present invention is the photocurable composition for coating a stepped substrate according to any one of the first to third aspects, wherein X is a carbonyl group.

A fifth aspect of the present invention is the photocurable composition for coating a stepped substrate according to the first aspect, the photocurable composition is a polymer containing the unit structure of Formula (1), wherein n1 is 1 or 2 and n2 and n3 are 0.

A sixth aspect of the present invention is the photocurable composition for coating a stepped substrate according to any one of the first to fifth aspects, wherein the polymer containing the unit structure of Formula (1) further contains a unit structure of Formula (3):

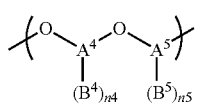

Formula (3)

(wherein A$^4$ and A$^5$ are each an aromatic C$_{6-48}$ ring optionally containing a heteroatom or a hydrocarbon group containing an aromatic C$_{6-48}$ ring optionally containing a heteroatom, B$^4$ and B$^5$ are the same groups as B$^1$, B$^2$, and B$^3$ in Formula (2) described above, n4 is an integer of 1 or more and 4 or less, n5 is an integer of 0 or more and 4 or less, and n4+n5 is an integer of 1 to 8).

A seventh aspect of the present invention is the photocurable composition for coating a stepped substrate according to any one of the first to sixth aspects, wherein the polymer containing the unit structure of Formula (1) or the unit structures of Formulae (1) and (3) further contains a unit structure of Formula (1'), wherein in Formula (1), n1 is 0, n2 is 0, and n3 is 0.

An eighth aspect of the present invention is the photocurable composition for coating a stepped substrate according to any one of the first to seventh aspects, which is a resist underlayer film-forming composition used in a lithography process in manufacturing of a semiconductor device.

A ninth aspect of the present invention is a method for manufacturing a coating substrate including a step (i) of applying the photocurable composition for coating a stepped substrate according to any one of the first to eight aspects to a stepped substrate, and a step (ii) of exposing the photocurable composition for coating a stepped substrate.

A tenth aspect of the present invention is the method for manufacturing a coating substrate according to the ninth aspect, further including a step (ia) of heating the substrate at a temperature of 70 to 400° C. for 10 seconds to 5 minutes after the photocurable composition for coating a stepped substrate is applied in the step (i).

An eleventh aspect of the present invention is the method for manufacturing a coating substrate according to the eighth or tenth aspect, wherein a wavelength of exposure light in the step (ii) is 150 nm to 248 nm.

A twelfth aspect of the present invention is the method for manufacturing a coating substrate according to any one of the ninth to eleventh aspects, wherein an exposure dose in the step (ii) is 10 mJ/cm$^2$ to 3,000 mJ/cm$^2$.

A thirteenth aspect of the present invention is the method for manufacturing a coating substrate according to any one of the ninth to twelfth aspects, wherein the substrate has an open area (unpatterned area) and a pattern area including dense (DENCE) and crude (ISO) patterns, and an aspect ratio of the patterns is 0.1 to 10.

A fourteenth aspect of the present invention is the method for manufacturing a coating substrate according to the thirteenth aspect, wherein a difference in level of coating (Bias) between the open area and the pattern area is 1 to 50 nm.

A fifteenth aspect of the present invention is a method for manufacturing a semiconductor device including steps of forming an underlayer film from the composition for coating a stepped substrate according to any one of the first to eighth aspects on a stepped substrate, forming a resist film on the underlayer film, irradiating the resist film with light or an electron beam, followed by development, to form a resist pattern, etching the underlayer film through the resist pattern, and processing a semiconductor substrate through the patterned underlayer film.

A sixteenth aspect of the present invention is a method for manufacturing a semiconductor device including steps of forming an underlayer film from the photocurable composition for coating a stepped substrate according to any one of the first to eighth aspects on a stepped substrate, forming a hard mask on the underlayer film, forming a resist film on the hard mask, irradiating the resist film with light or an electron beam, followed by development, to form a resist pattern, etching the hard mask through the resist pattern, etching the underlayer film through the patterned hard mask, and processing a semiconductor substrate through the patterned underlayer film.

Effects of the Invention

In the present invention, the composition for coating a stepped substrate is applied to a substrate, and if necessary, is further heated resulting in reflowing, and a pattern is filled with the composition. In this case, the viscosity of the composition for coating a stepped substrate is not increased due to the absence of a thermal crosslinking moiety and an acid catalyst, and a flat film is formed regardless of the open area (unpatterned area) and the pattern area including dense (DENCE) and crude (ISO) patterns. A crosslinking structure is then formed between unsaturated carbon-carbon bonds through radical species by irradiation of the unsaturated bonds with light. The composition for coating a stepped substrate of the present invention does not contain a crosslinker and an acid catalyst, and in the film for coating the stepped substrate (flattening film) formed by applying the composition for coating a stepped substrate, crosslinking can be achieved by a reaction between double bonds derived from unsaturated carbon-carbon double bonds.

During thermal reflowing, a crosslinking reaction caused by a crosslinker and an acid catalyst does not occur and subsequent photocrosslinking is a photoreaction without degassing. Therefore, heat shrinkage does not occur in the film for coating the stepped substrate (flattening film) formed from the composition for coating a stepped substrate of the present invention. Thus, both the properties of filling a pattern and the flattening properties after filling are satisfied and an excellent flattening film can be formed.

The photocurable composition for coating a stepped substrate of the present invention is a stepped substrate-coating composition having high properties of filling a pattern and capable of forming on a substrate a coating film that can be formed by photocuring without occurrence of degassing and heat shrinkage, has flattening properties, and high heat resistance after irradiation with light. A photocurable film for coating a stepped substrate has sufficient heat resistance even when a hard mask layer of high temperature is formed on the photocurable film for coating a stepped substrate.

MODES FOR CARRYING OUT THE INVENTION

The present invention of the present application is a photocurable composition for coating a stepped substrate containing a polymer containing a unit structure of Formula (1).

In Formula (1), $A^1$, $A^2$, and $A^3$ are each independently an aromatic $C_{6-100}$ ring optionally containing a heteroatom or a hydrocarbon group containing an aromatic $C_{6-100}$ ring optionally containing a heteroatom, $B^1$, $B^2$, and $B^3$ are each independently Formula (2), X is a carbonyl group, a sulfonyl group, a $—CR^2{}_2—$ group, or a $—C(CF_3)_2—$ group, $R^2$ is a hydrogen atom or a $C_{1-10}$ alkyl group, n1 is an integer of 1 or more and 4 or less, n2 is an integer of 0 or more and 4 or less, n3 is an integer of 0 or more and 4 or less, and n1+n2+n3 is an integer of 1 to 12. Examples of the heteroatom include a nitrogen atom and an oxygen atom.

Examples of the aforementioned hydrocarbon group containing an aromatic $C_{6-100}$ ring include hydrocarbon groups derived from the following alkyl groups.

Examples of the aromatic $C_{6-100}$ ring include a benzene ring, a biphenyl ring, a terphenylene ring, a fluorene ring, a naphthalene ring, an anthryl ring, a pyrene ring, a carbazole ring, and an indole ring.

In Formula (2), $R^1$ is a $C_{1-10}$ alkylene group, a $C_{1-10}$ alkenylene group, a $C_{1-10}$ alkynylene group, a $C_{6-40}$ arylene group (the alkylene group, the alkenylene group, the alkynylene group, and the arylene group are optionally substituted with one or two or more cyano groups and/or one or two or more hydroxyl groups), an oxygen atom, a carbonyl group, a sulfur atom, $—C(O)—O—$, $—C(O)—NR^a—$, $—NR^b—$, or a group including a combination thereof, $R^2$ is a hydrogen atom or a $C_{1-10}$ alkyl group, and a dotted line is a bond with $A^1$, $A^2$, or $A^3$.

Provided that in $R^1$, an oxygen atom, a carbonyl group, a sulfur atom, $—C(O)—O—$, $—C(O)—NR^a—$, and $—NR^b—$ are not bonded to each other.

$A^1$ described above may be a group derived from a polynuclear phenol of Formula (1-1) or (1-2). The polynuclear phenol has at least three hydroxyl groups, and preferably 3 to 6, 3 to 5, or 3 to 4 hydroxyl groups. Herein, the number of hydroxyl groups of the polynuclear phenol is intended to be m×q.

$A^1$ is a group formed by removing two hydroxyl groups from m×q hydroxyl groups of the polynuclear phenol. For example, the unit structure of Formula (1) can be formed by forming a polymer by dehydrohalogenation of two hydroxyl groups among m×q hydroxyl groups of the polynuclear phenol with a dihalogenated diaryl group containing the X moiety and introducing a functional group of Formula (2) into the rest hydroxyl groups of the polymer. At that time, the hydroxyl groups of the polymer can be subjected to an addition reaction with an unsaturated group-containing epoxy compound such as allyl glycidyl ether, glycidyl acrylate, and glycidyl methacrylate, to form the polymer containing the unit structure of Formula (1).

Alternatively, the hydroxyl groups of the polymer can be reacted with halogenated ally (e.g., ally bromide and allyl chloride) to form the polymer containing the unit structure of Formula (1).

The hydroxyl groups of the polymer are epoxidized by an epoxy compound such as epichlorohydrin and then reacted with an unsaturated carboxylic acid corresponding to Formula (2) (e.g., acrylic acid and methacrylic acid). Thus, the polymer containing the unit structure of Formula (1) can be formed.

In the polynuclear phenol of Formulae (1-1) and (1-2) for forming $A^1$, $T^1$s are each independently a halogen group, a $C_{1-10}$ alkyl group, a $C_{6-18}$ aryl group, a $C_{7-28}$ arylalkyl group, a $C_{2-10}$ alkylcarbonyl group, a $C_{2-10}$ alkylcarbonyloxy group, a $C_{2-10}$ alkylcarbonylamino group, a $C_{7-28}$ aryloxyalkyl group, a $C_{1-6}$ alkoxy group, or an organic group including a combination thereof, q is an integer of 2 to 6, provided that when q is 2, $T^2$ is a single bond or a divalent $C_{1-10}$ hydrocarbon group optionally having a hydroxyl group or a divalent $C_{7-28}$ arylalkyl group optionally having a hydroxyl group, or when q is 3 to 6, $T^2$ is a trivalent to hexavalent $C_{1-10}$ hydrocarbon group optionally having a hydroxyl group or a trivalent to hexavalent $C_{7-28}$ arylalkyl group optionally having a hydroxyl group, m is an integer of 1 to 7, n is an integer of 0 or more and 7-m or less, two $T^2$s in Formula (1-2) optionally form a ring together, and p is an integer of 0 or 1.

In the polynuclear phenol of Formula (1-1) or (1-2), two hydroxyl groups among m×q hydroxyl groups are replaced by two bonds between $A^1$ and two O atoms, and the rest of the m×q hydroxyl groups in the polynuclear phenol and/or a hydrogen atom in $T^2$ are replaced by bonds between $A^1$ and $B^1$, provided that the total number of the bonds with $B^1$ is n1.

Examples of the aforementioned polynuclear phenol include as follows.

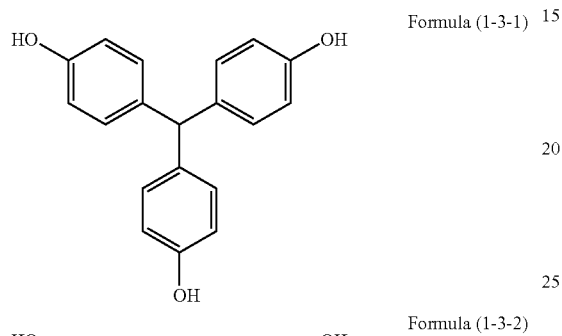

Formula (1-3-1)

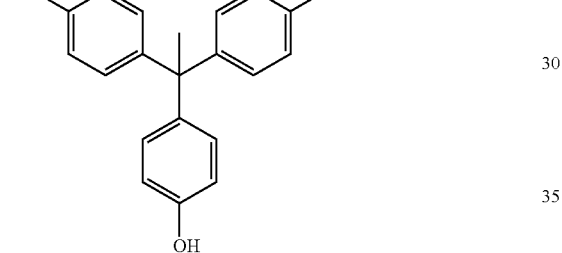

Formula (1-3-2)

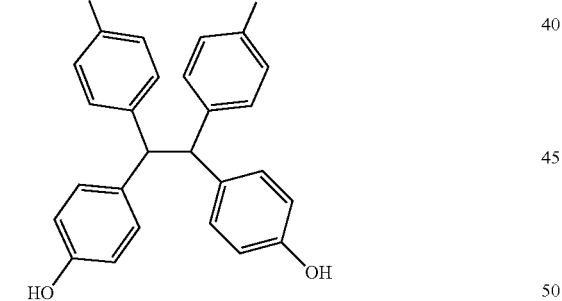

Formula (1-3-3)

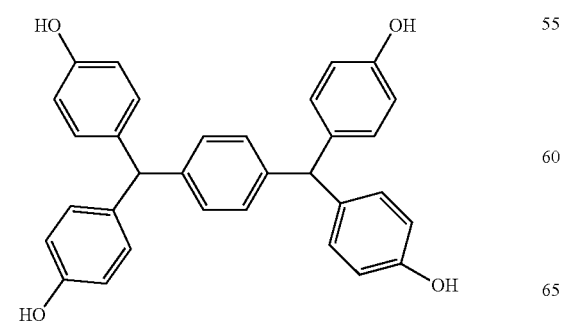

Formula (1-3-4)

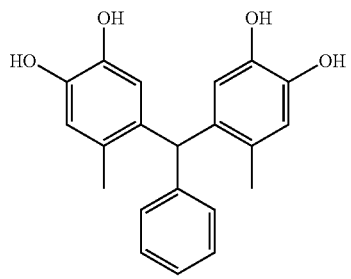

Formula (1-3-5)

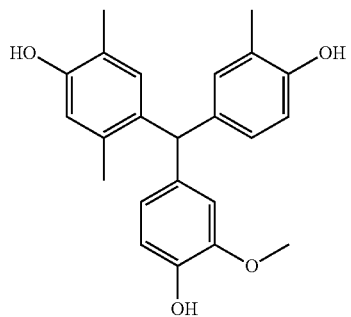

Formula (1-3-6)

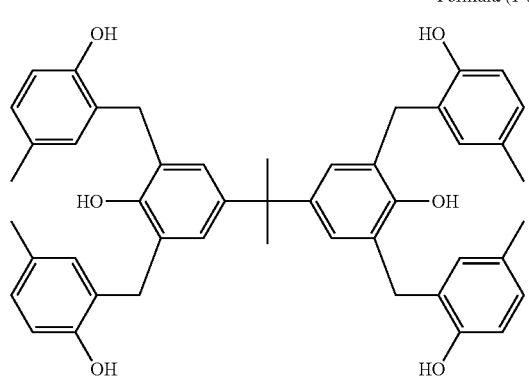

Formula (1-3-7)

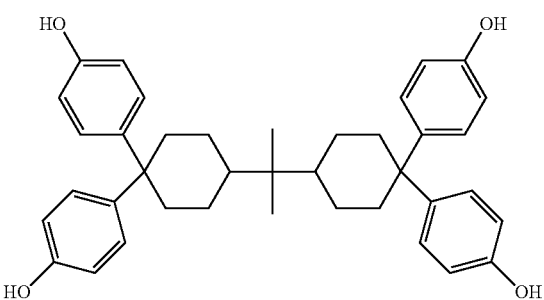

Formula (1-3-8)

Formula (1-3-9)

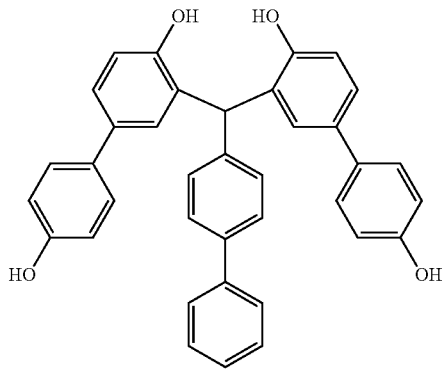

Formula (1-3-10)

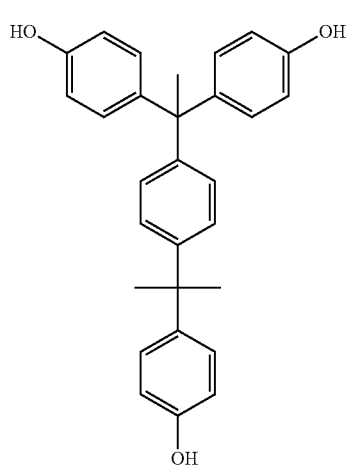

Formula (1-3-11)

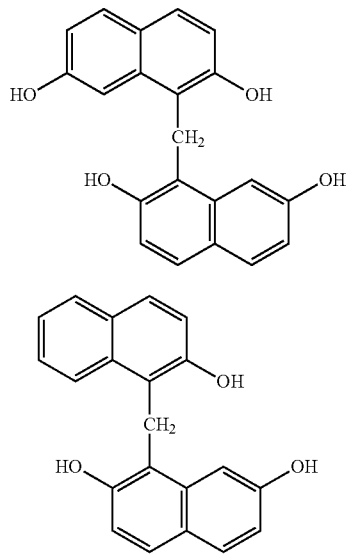

Formula (1-3-12)

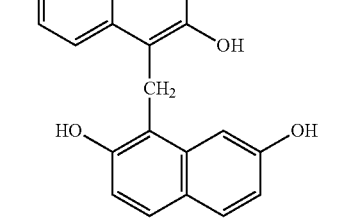

Formula (1-3-13)

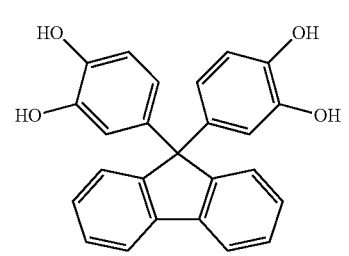

Formula (1-3-14)

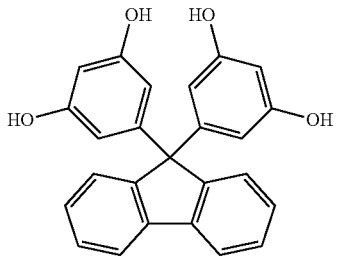

Formula (1-3-15)

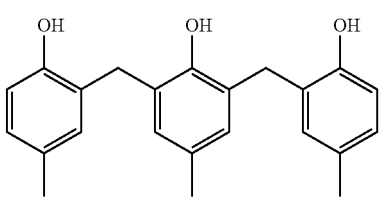

Formula (1-3-16)

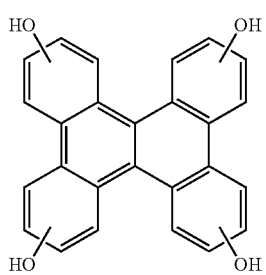

Formula (1-3-17)

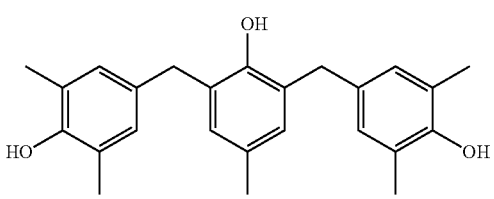

Formula (1-3-18)

It is preferable that in the polymer of Formula (1), $A^1$ be a group derived from tri(hydroxyphenyl)methane, a group derived from tetrakis(hydroxyphenyl)ethane, or a group derived from tetrakis(hydroxyphenyl)-p-xylene, and $A^2$ and $A^3$ be a group derived from a benzene ring or a naphthalene ring. It is further preferable that the polymer be a group having a tri(hydroxyphenyl)methane structure, a group having a tetrakis(hydroxyphenyl)ethane structure, or a group having tetrakis(hydroxyphenyl)-p-xylene structure.

The polymer in which in Formula (1), X is a carbonyl group may be preferably used.

The polymer in which in Formula (1), n1 is 1 or 2 and n2 and n3 are 0 may be used.

The composition for coating a stepped substrate may contain an additive such as a surfactant, if necessary.

The solid content of the composition is 0.1 to 70% by mass, 0.1 to 60% by mass, 0.2 to 30% by mass, or 0.3 to 15% by mass. The solid content is a content ratio of all components except for a solvent in the composition for coating a stepped substrate. The solid content may contain the aforementioned polymer in an amount of 1 to 100% by mass, 1 to 99.9% by mass, 50 to 99.9% by mass, 50 to 95% by mass, or 50 to 90% by mass.

The polymer used in the present invention has a weight average molecular weight of 600 to 1,000,000, 600 to 200,000, or 1,500 to 15,000.

In the aforementioned polymer, a crosslinking structure can be formed by a photoreaction of unsaturated carbon-carbon bonds between or in the molecules. However, the polymer may have at least one or a plurality of (e.g., 1 to 1,000) unsaturated bonds between carbon atoms, that is, unsaturated double bonds between carbon atoms in the molecule.

Examples of the aforementioned alkyl group include $C_{1-10}$ alkyl groups such as methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 2-ethyl-cyclobutyl group, 2,2-dimethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the aforementioned $C_{2-10}$ alkylcarbonyl group include groups in which each of $C_{1-9}$ alkyl groups exemplified above is bonded with a carbonyl group. Examples of the aforementioned $C_{2-10}$ alkylcarbonyloxy group include groups in which each of $C_{1-9}$ alkyl groups exemplified above is bonded with a carbonyloxy group. Examples of the aforementioned $C_{2-10}$ alkylcarbonylamino group include groups in which each of $C_{1-9}$ alkyl groups exemplified above is bonded with a carbonylamino group. Examples of the aforementioned $C_{1-6}$ alkoxy group include groups in which each of $C_{1-6}$ alkyl groups exemplified above is bonded with an oxygen atom.

Examples of the aforementioned aryl group include $C_{6-40}$ aryl groups such as phenyl group, biphenyl group, terphenylene group, fluorene group, naphthyl group, anthryl group, pyrene group, and carbazole group. Examples of the aforementioned $C_{6-18}$ aryl group also include phenyl group, biphenyl group, terphenylene group, fluorene group, naphthyl group, anthryl group, pyrene group, and carbazole group.

Examples of the $C_{7-28}$ arylalkyl group include groups that are obtained by substituting the aforementioned $C_{1-10}$ alkyl groups with the aforementioned $C_{6-18}$ aryl groups and have a carbon atom number of 7 to 28. Examples of the $C_{7-28}$ aryloxyalkyl group include groups that are obtained by substituting the aforementioned $C_{1-10}$ alkyl groups with the aforementioned $C_{6-18}$ aryl groups through an oxygen atom and have a carbon atom number of 7 to 28.

Examples of the aforementioned alkenyl group include $C_{1-10}$ alkenyl groups such as ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, and 1-i-propylethenyl group.

Examples of the aforementioned alkynyl group include $C_{1-10}$ alkynyl groups such as ethynyl group, 1-propynyl group, 2-propynyl group, 1-butynyl group, 2-butynyl group, 3-butynyl group, 1-methyl-2-propynyl group, 1-pentynyl group, 2-pentynyl group, 3-pentynyl group, 4-pentynyl group, 1-methyl-2-butynyl group, 1-methyl-3-butynyl group, 2-methyl-3-butynyl group, 3-methyl-1-butynyl group, 1,1-dimethyl-2-propynyl group, 2-ethyl-2-propynyl group, 1-hexynyl group, 2-hexynyl group, 3-hexynyl group, 4-hexynyl group, 5-hexynyl group, 1-methyl-2-pentynyl group, 1-methyl-3-pentynyl group, and 1-methyl-4-pentynyl group.

Examples of the aforementioned alkylene group include divalent organic groups derived from the aforementioned alkyl groups. Examples of the aforementioned arylene group include divalent organic groups derived from the aforementioned aryl groups. Examples of the aforementioned alkenylene group include divalent organic groups derived from the aforementioned alkenyl groups. Examples of the aforementioned alkynylene group include divalent organic groups derived from the aforementioned alkynyl groups.

The polymer containing the unit structure of Formula (1) may further contain the unit structure of Formula (3).

In Formula (3), $A^4$ and $A^5$ are each an aromatic $C_{6-48}$ ring optionally containing a heteroatom or a hydrocarbon group containing an aromatic $C_{6-48}$ ring optionally containing a heteroatom, $B^4$ and $B^5$ are the same groups as those in Formula (2) described above, n4 is an integer of 1 or more and 4 or less, n5 is an integer of 0 or more and 4 or less, and n4+n5 is an integer of 1 to 8. Examples of the heteroatom include a nitrogen atom and an oxygen atom. Examples of the aromatic $C_{6-48}$ ring include a benzene ring, a biphenyl ring, a terphenylene ring, a fluorene ring, a naphthalene ring, an anthryl ring, a pyrene ring, a carbazole ring, and an indole ring.

Examples of hydrocarbon groups in the aforementioned hydrocarbon group containing an aromatic $C_{6-48}$ ring include hydrocarbon groups derived from the aforementioned alkyl groups.

When the polymer contains the unit structure of Formula (1) and the unit structure of Formula (3), the unit structure of Formula (1) and the unit structure of Formula (3) may be contained at a molar ratio of the unit structure of Formula (1) to the unit structure of Formula (3) of 1:0.1 to 1:10, 1:0.5 to 1:5, or 1:1.

Examples of the polymer used in the present invention include as follows.

Formula (1-4-1)

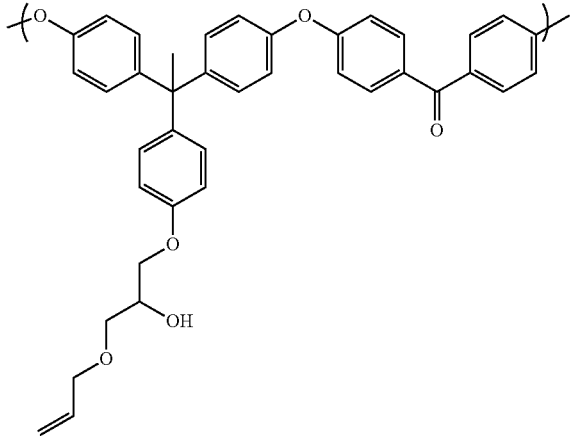

Formula 1-4-2)

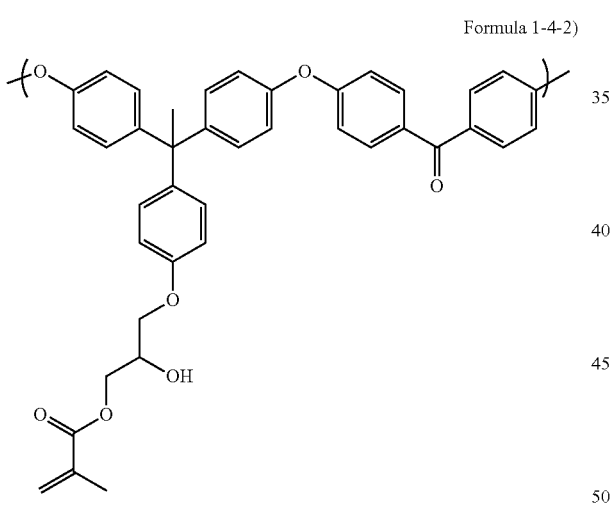

Formula 1-4-3)

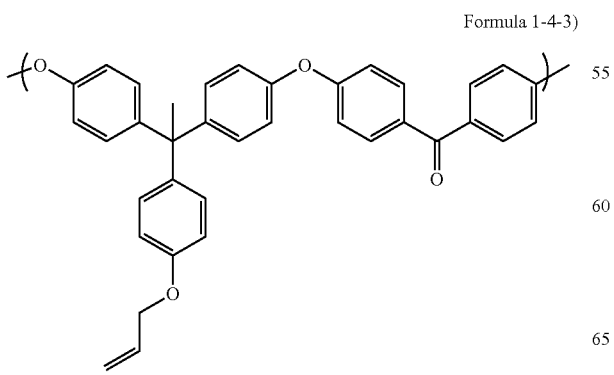

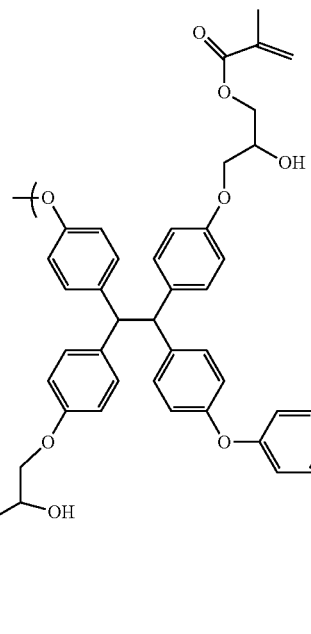

Formula (1-4-4)

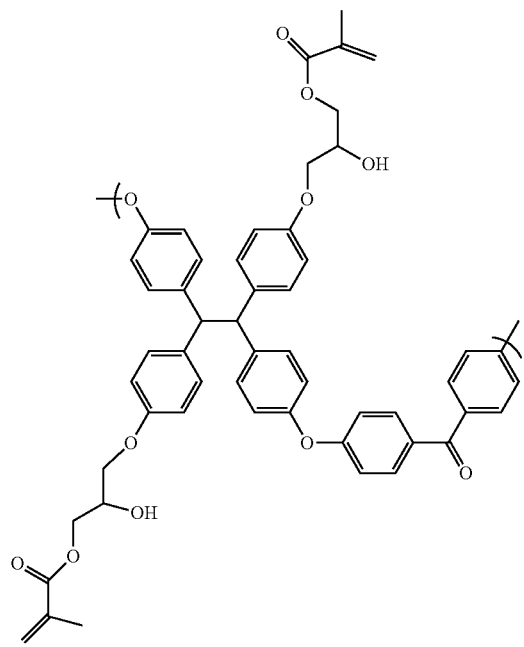
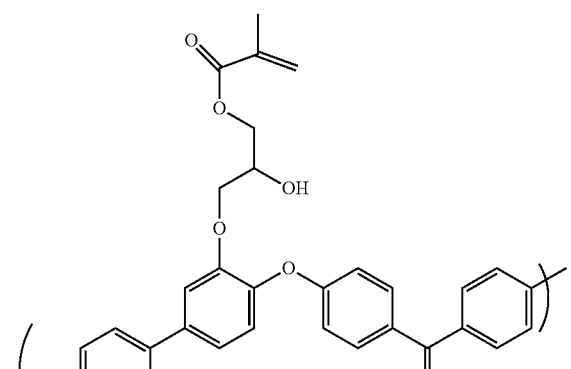
Formula (1-4-6)
Formula (1-4-5)
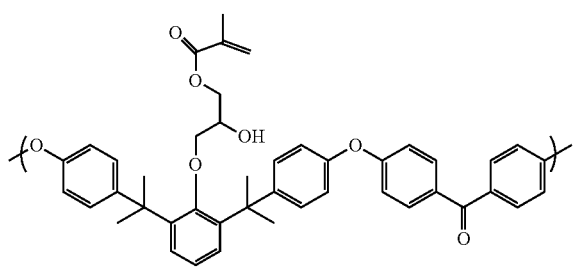
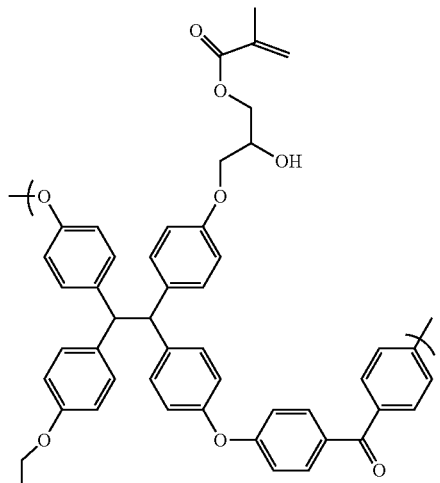
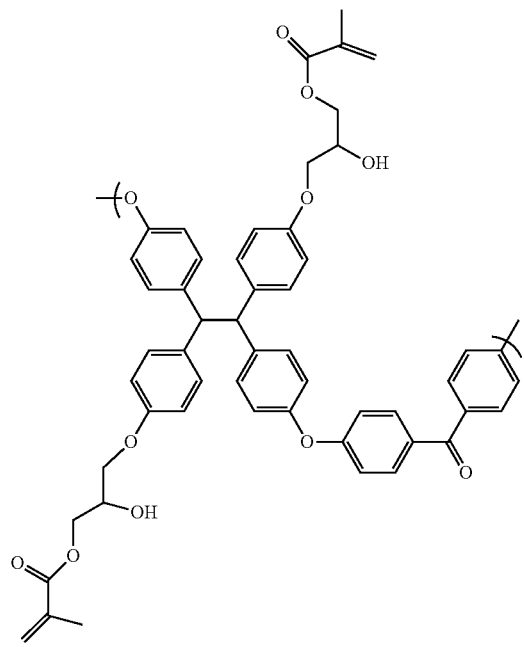
Formula (1-4-7)
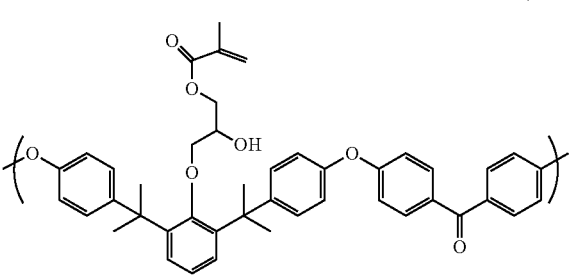

17
-continued
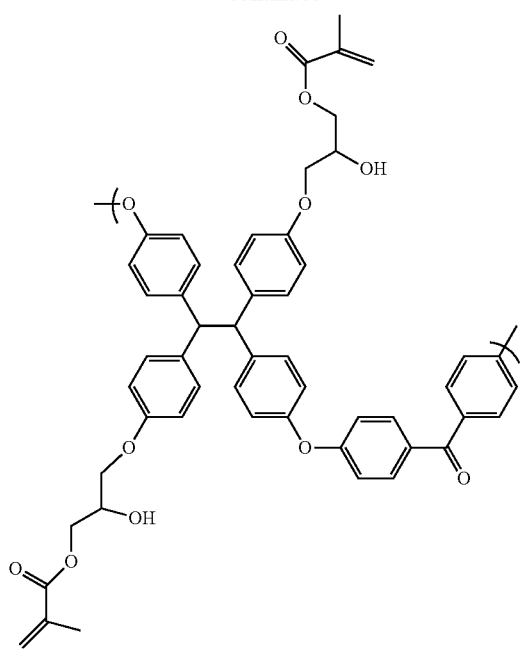
18
-continued
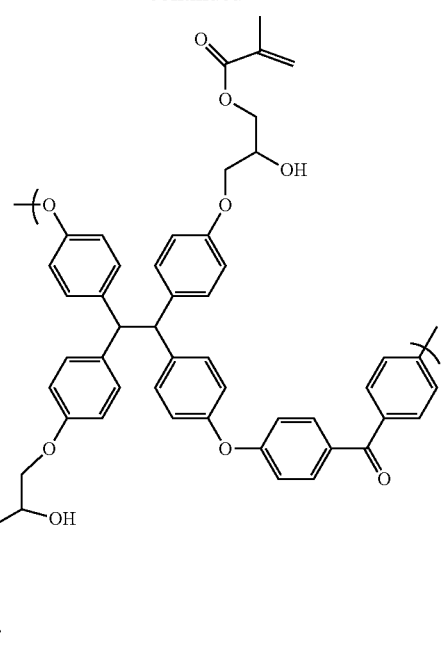
Formula (1-4-8)
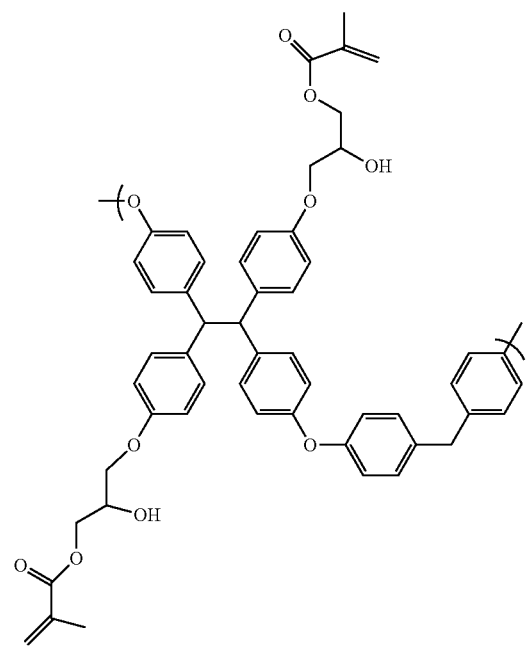
Formula (1-4-9)
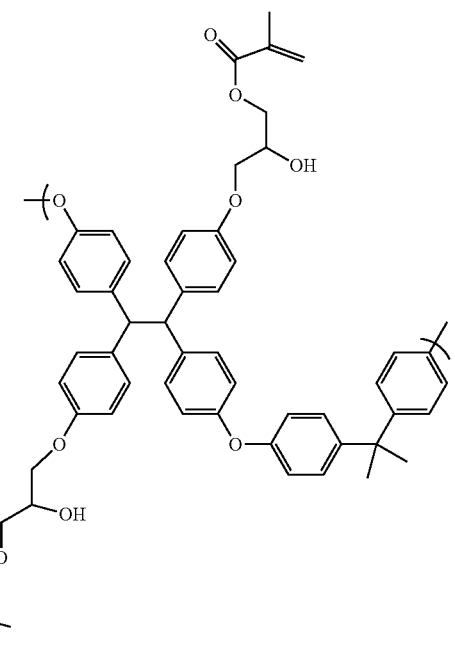

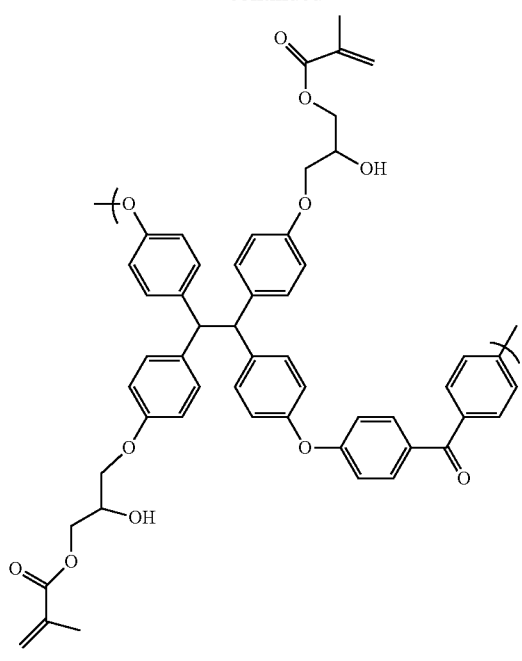
Formula (1-4-10)
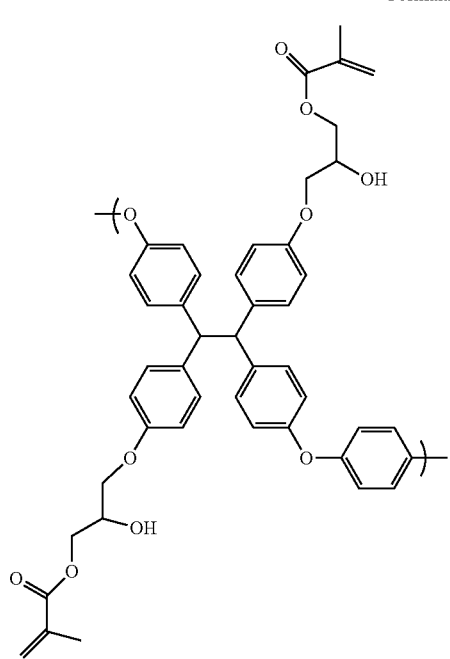
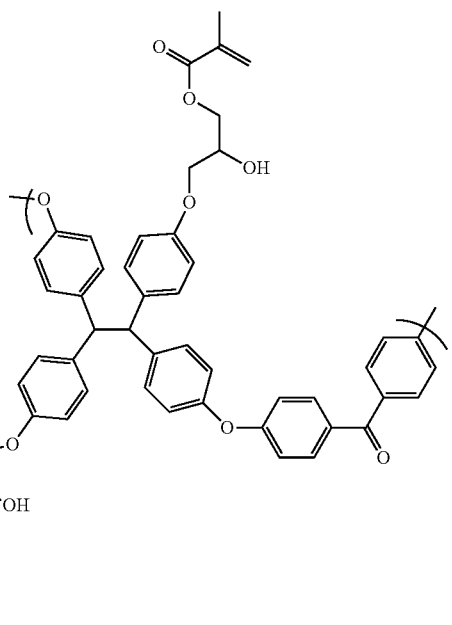
Formula (1-4-11)
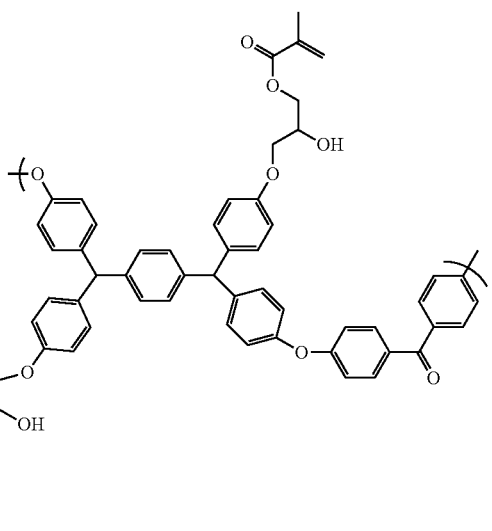
Formula (1-4-12)
Polymers in which $A^1$, $A^2$, $A^3$, $A^4$, $A^5$, $B^1$, $B^2$, $B^3$, $B^4$, and $T^2$ described above are represented by Formulae (1-4-1) to (1-4-12) described above are as follows.

Formula (1-4-1)
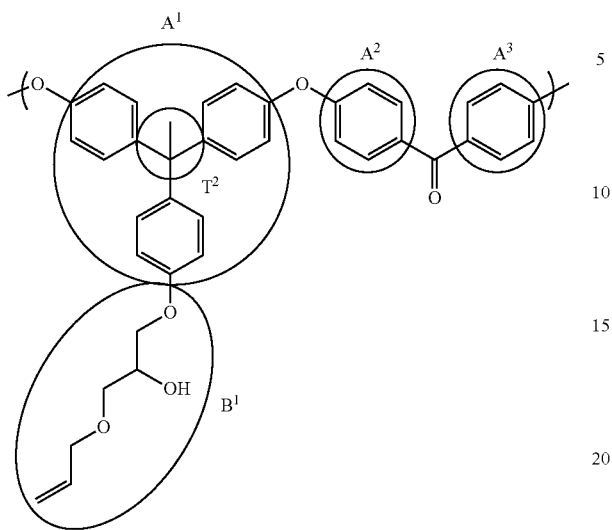
Formula (1-4-2)
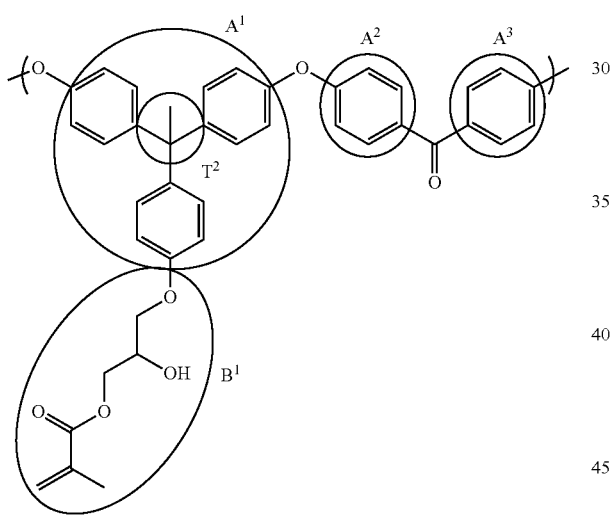
Formula (1-4-3)
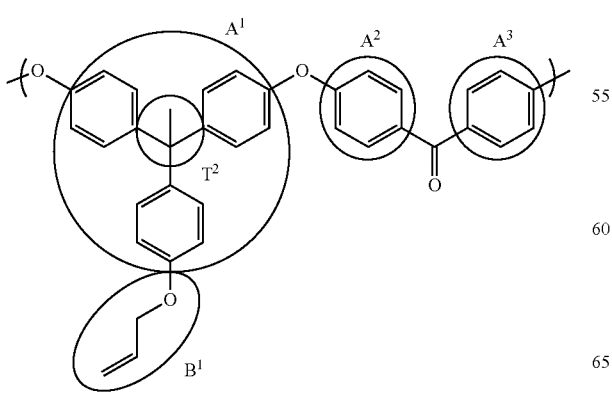
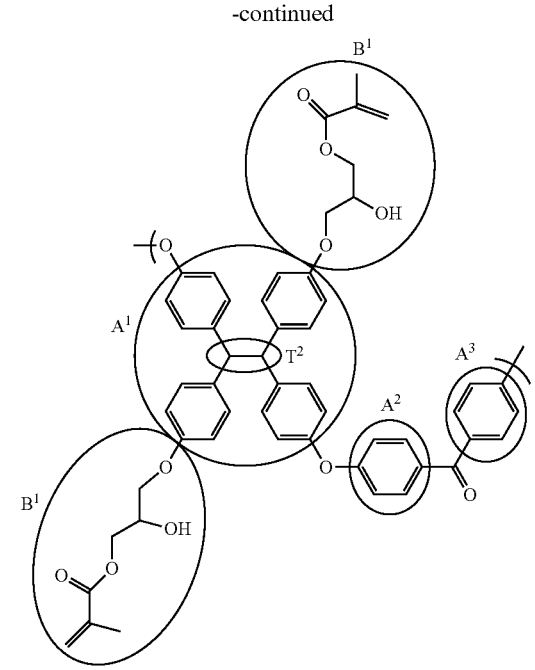
Formula (1-4-4)
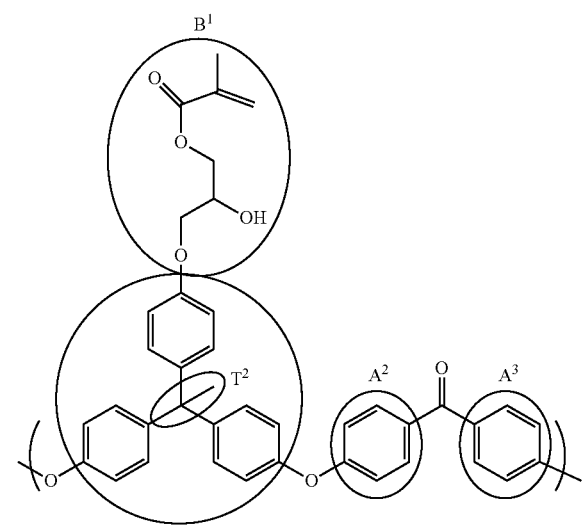

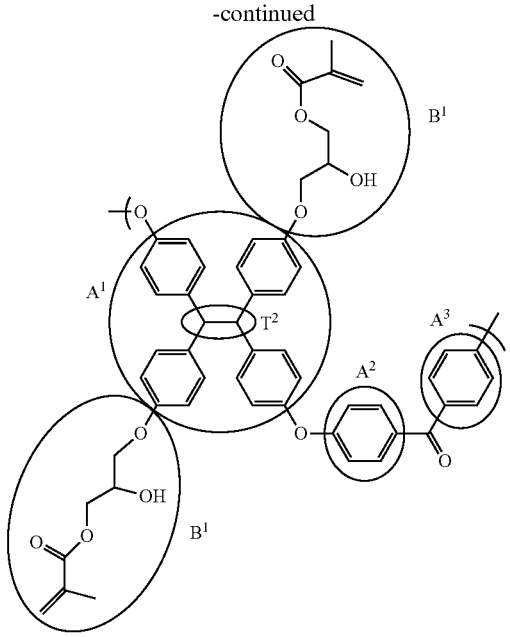
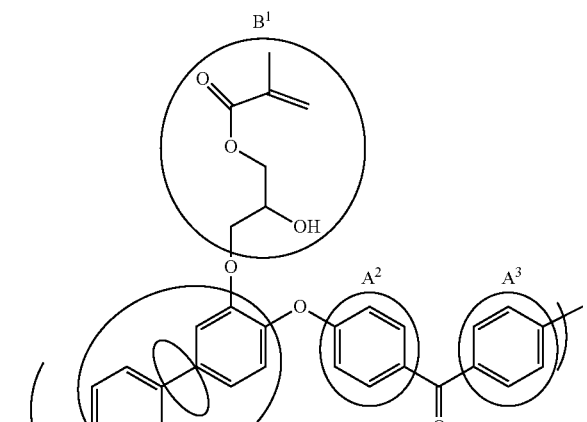
Formula (1-4-6)
Formula (1-4-5)
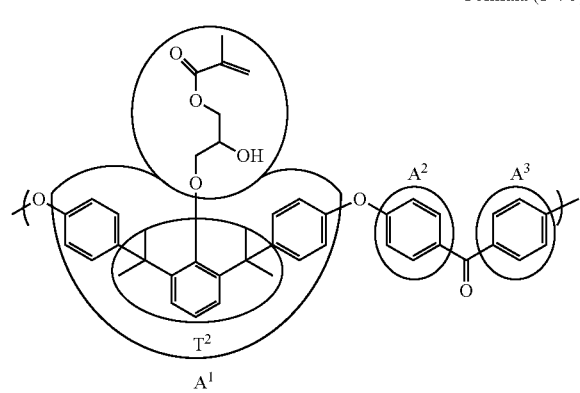
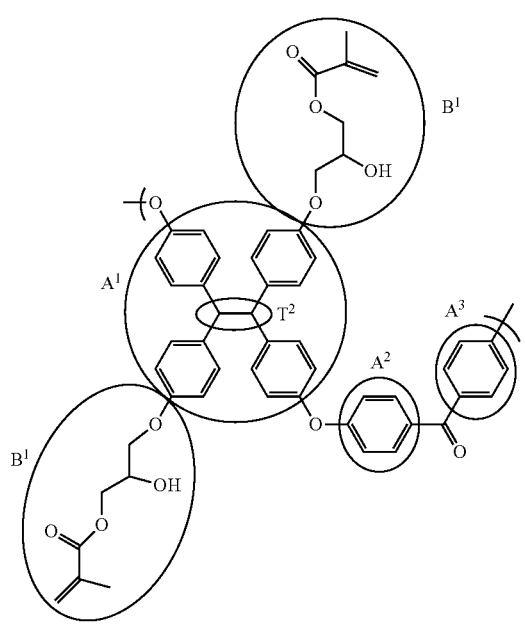
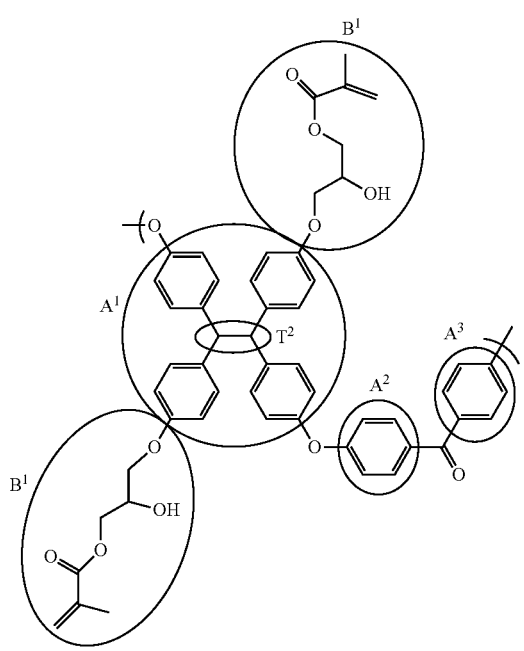
Formula (1-4-7)
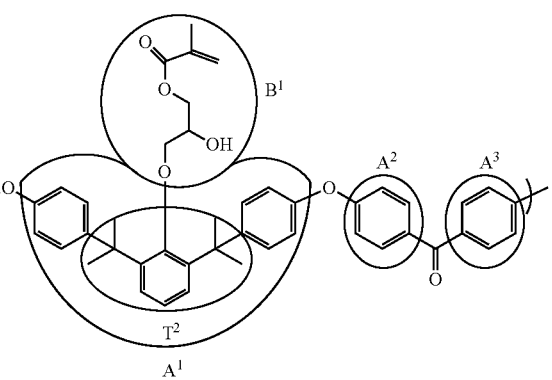

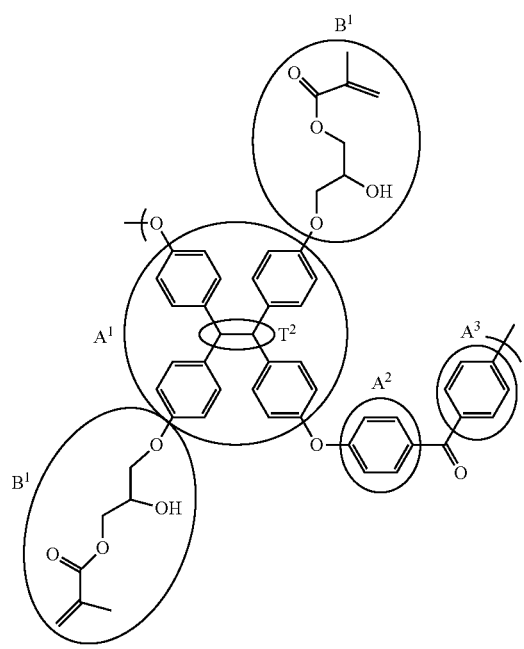
Formula (1-4-8)
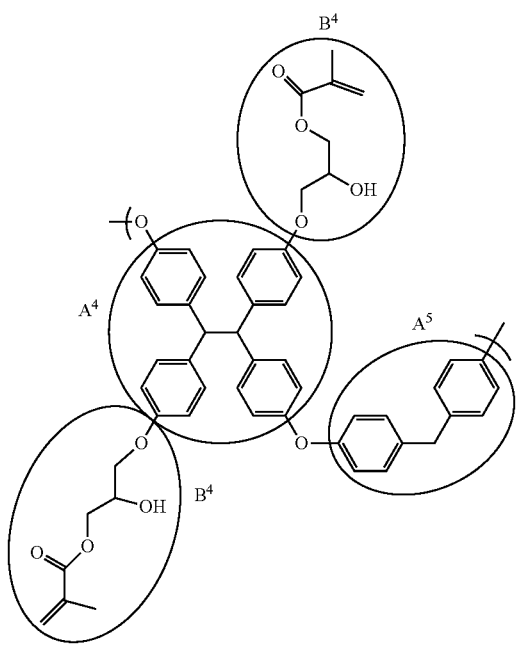
Formula (1-4-9)
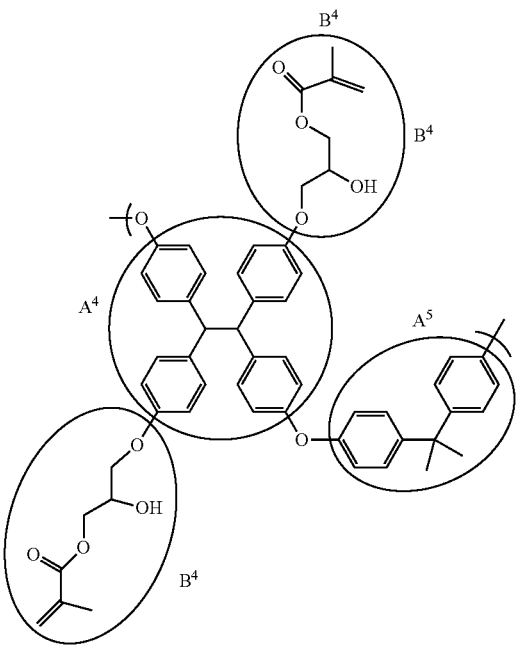

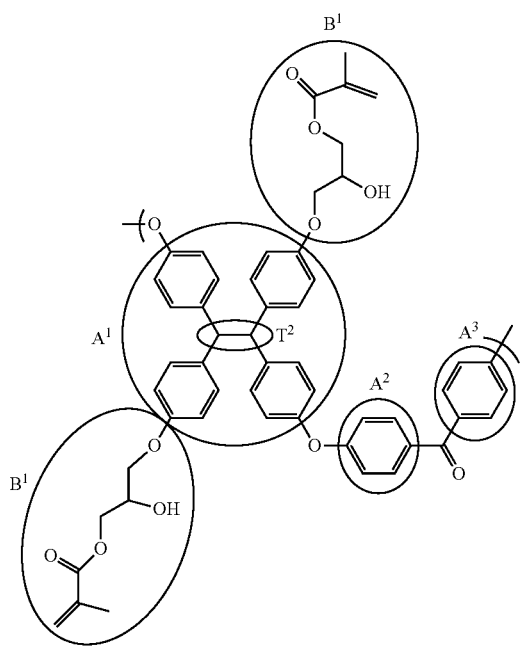

Formula (1-4-10)

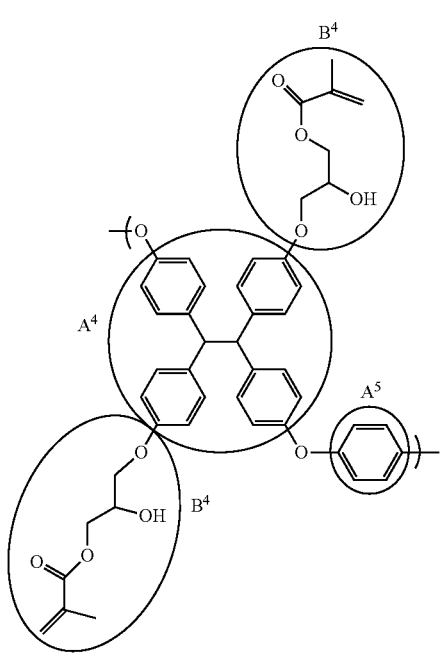

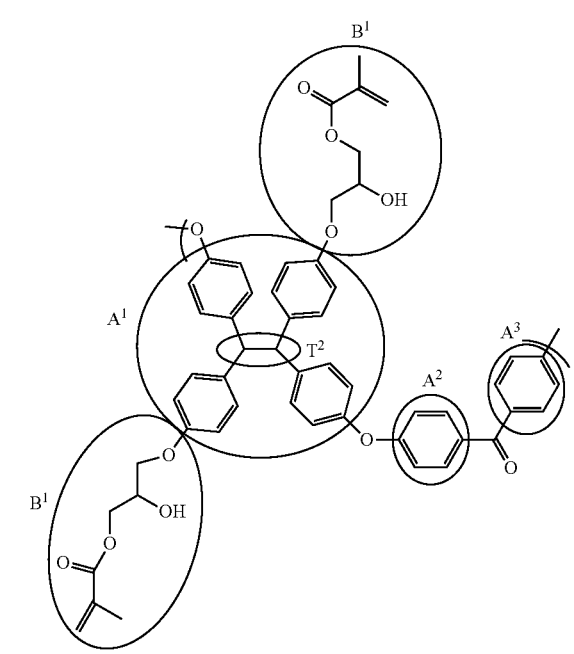

Formula (1-4-11)

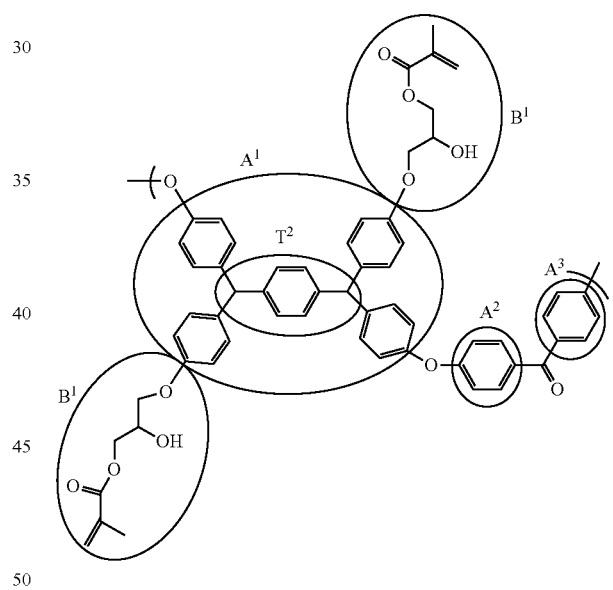

Formula (1-4-12)

The composition for coating a stepped substrate of the present invention may contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop [registered trademark] EF301, EF303, and EF352 (available from Mitsubishi Materials Electronic Chemicals Co., Ltd.), MEGAFACE [registered trademark] F171, F173, R30, R40, R-30N, and R40-LM (available from DIC Corporation), Fluorad FC430 and FC431 (available from Sumitomo 3M, Ltd.), Asahi Guard [registered trademark] AG710, and Surflon [registered trademark] S-382, SC101, SC102, SC103, SC104, SC105, and SC106 (available from Asahi Glass Co., Ltd.), and organosiloxane polymer KP341 (available from Shin-Etsu Chemical Co., Ltd.). One type selected from the surfactants may be added, or two or more types thereof may be added in combination. The content of the surfactant is, for example, 0.01% by mass to 5% by mass relative to the solid content of the composition for coating a stepped substrate of the present invention except for a solvent described below.

As a solvent of dissolving the polymer in the present invention, ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl n-butyl ketone, isopropyl acetate ketone, n-propyl acetate, isobutyl acetate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethyl hexanol, 1-octanol, ethylene glycol, hexylene glycol, trimethylene glycol, 1-methoxy-2-butanol, diacetone alcohol, furfuryl alcohol, tetrahydrofurfuryl alcohol, propylene glycol, benzyl alcohol, isopropyl ether, 1,4-dioxane, N,N-dimethylpatanmuamide, N,N-dimethylacetamide, N-methylpyrrolidone, 1,3-dimethyl-2-imidazolidinone, dimethylsulfoxide, or N-cyclohexyl-2-pyrrolidinone may be used. The organic solvent is used alone, or two or more types thereof are used in combination.

Next, a method for forming a flattening film using the composition for coating a stepped substrate of the present invention will be described. The stepped substrate-coating composition is applied to a substrate used in manufacturing of a precision integrated circuit element (e.g., a transparent substrate such as a silicon/silicon dioxide coating, a glass substrate, and an ITO substrate) by an appropriate coating method using a spinner or a coater, baked (heated), and exposed to form a coating film. Specifically, the method for forming a flattening film includes a step (i) of applying the stepped substrate-coating composition to a stepped substrate, and a step (ii) of exposing the composition, and a coated substrate is manufactured.

When a spinner is used for applying, for example, the applying can be carried out at a rotation number of 100 to 5,000 for 10 to 180 seconds.

As the substrate, a substrate having an open area (unpatterned area) and a pattern area including dense (DENCE) and coarse (ISO) patterns and an aspect ratio of the patterns of 0.1 to 10 can be used.

The unpatterned area is a portion having no pattern (e.g., a hole or a trench structure) on the substrate. The dense (DENCE) pattern is a portion that is dense with patterns on the substrate, and the coarse (ISO) pattern is a portion where a distance between the patterns is long and the patterns are scattered on the substrate. The aspect ratio of the patterns is a ratio of pattern depth to pattern width. The pattern depth is usually several hundreds nm (e.g., about 100 to 300 nm). The dense (DENCE) pattern is a portion where the patterns of several tens nm (e.g., 30 to 80 nm) are densely disposed at intervals of about 100 nm. The coarse (ISO) pattern is a portion where the patterns of several hundreds nm (e.g., about 200 to 1,000 nm) are scattered.

Herein, the thickness of the stepped substrate-coating film (flattening film) is preferably 0.01 to 3.0 µm. Further, in step (ia), heating can be carried out after applying. The condition of heating includes at 70 to 400° C. or 100 to 250° C. for 10 seconds to 5 minutes or 30 seconds to 2 minutes. By this heating, the stepped substrate-coating composition is reflowed to form a flat stepped substrate-coating film (flattening film).

When in step (ia), heating is carried out after applying, a crosslinker and a crosslinking catalyst can be added. By this heating, thermal curing is carried out, and photocrosslinking is assisted. When a lower portion of the composition for coating a stepped substrate cannot be sufficiently photocured, this heating effectively functions. Therefore, thermal curing can be carried out in combination within a range which does not influence a reduction of flattening properties with degassing caused by thermal curing.

Examples of the crosslinker include a melamine-based crosslinker, a substituted urea-based crosslinker, and polymers thereof. The crosslinker is preferably a crosslinker having at least two crosslinking forming substituents. Examples thereof include compounds including methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. A condensate of the compounds may be also used. The amount of the crosslinker to be added is 0.001 to 80% by mass, preferably 0.01 to 50% by mass, and further preferably 0.05 to 40% by mass, relative to the total solid content.

As a catalyst for promoting a crosslinking reaction, an acid and/or an acid generator may be added. For example, an acidic compound such as p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, or naphthalenecarboxylic acid, and/or a thermal acid generator such as 2,4,4,6-tetrabromocyclohexadienone, benzoin tosylate, 2-nitrobenzyl tosylate, and another organic sulfonic acid alkyl ester may be mixed. The amount of the catalyst to be mixed is 0.0001 to 20% by mass, preferably 0.0005 to 10% by mass, and more preferably 0.01 to 3% by mass, relative to the total solid content.

The exposure light in step (ii) is actinic radiation such as near ultraviolet light, far ultraviolet light, or extreme ultraviolet light (e.g., EUV with a wavelength of 13.5 nm). For example, light having a wavelength of 248 nm (KrF laser beam), 193 nm (ArF laser beam), 172 nm (xenon excimer beam), or 157 nm ($F_2$ laser beam) can be used. Further, ultraviolet light having an exposure wavelength of 150 nm to 248 nm may be used, and ultraviolet light having a wavelength of 172 nm may be preferably used.

By exposure, crosslinking of the stepped substrate-coating film (flattening film) is carried out. The exposure dose in step (ii) may be 10 mJ/cm$^2$ to 3,000 mJ/cm$^2$. When the exposure does falls within this range, a photoreaction is caused to form crosslinking. Thus, solvent resistance is obtained.

In the stepped substrate-coating film (flattening film) thus formed, it is desirable that the difference in level of coating (Bias) between the open area and the pattern area be 0. The stepped substrate-coating film can be flattened so that Bias falls within a range of 1 to 50 nm or 1 to 25 nm. Bias between the open area and the area of DENCE pattern is about 15 to 20 nm, and Bias between the open area and the area of ISO pattern is about 1 to 10 nm.

The stepped substrate-coating film (flattening film) obtained by the present invention can be coated with a resist film, the resist film can be exposed and developed by lithography to form a resist pattern, and the substrate can be processed through the resist pattern. In this case, the stepped substrate-coating film (flattening film) is a resist underlayer film, and the stepped substrate-coating composition is a resist underlayer film-forming composition.

A resist is applied to the resist underlayer film, irradiated with light or an electron beam through a predetermined mask, developed, rinsed, and dried. Thus, a favorable resist pattern can be obtained. If necessary, post exposure bake (PEB) can be also carried out after irradiation with light or an electron beam. The resist underlayer film at a portion where the resist is developed and removed in the aforementioned step can be removed by dry etching, to form a desired pattern on the substrate.

The exposure light for the photoresist is actinic radiation such as near ultraviolet light, far ultraviolet light, or extreme ultraviolet light (e.g., EUV with a wavelength of 13.5 nm). For example, light having a wavelength of 248 nm (KrF laser beam), 193 nm (ArF laser beam), or 157 nm ($F_2$ laser beam) is used. In irradiation with light, any method can be used without particular restriction as long as it is a method capable of generating an acid from a photoacid generator in the resist. The exposure dose is 1 to 3,000 mJ/cm$^2$, 10 to 3,000 mJ/cm$^2$, or 10 to 1,000 mJ/cm$^2$.

In irradiation of electron beam resist with an electron beam, for example, an electron beam irradiation device may be used.

As a developer of a resist having a resist underlayer film formed from a resist underlayer film-forming material for lithography in the present invention, an aqueous solution of an alkali including inorganic alkalis such as sodium hydroxide, potassium hydroxide, sodium carbonate, sodium silicate, sodium methasilicate, and ammonia water, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine can be used. A solution in which proper amounts of an alcohol such as isopropyl alcohol and a surfactant such as a nonionic surfactant are added to the aqueous solution of the alkali may be also used. Among the developers, a quaternary ammonium salt is preferable, and tetramethylammonium hydroxide and choline are further preferable.

As the developer, an organic solvent may be used. Examples thereof include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, the surfactant or the like may be added to the developer. A development condition is appropriately selected from a development temperature of 5 to 50° C. and a development time of 10 to 600 seconds.

In the present invention, a semiconductor device can be manufactured through steps of forming the resist underlayer film on a semiconductor substrate from the resist underlayer film-forming composition, forming a resist film on the resist underlayer film, irradiating the resist film with with light or an electron beam, followed by development to form a resist pattern, etching the resist underlayer film through the resist pattern, and processing the semiconductor substrate through the patterned resist underlayer film.

When the resist pattern is made further finer, problems about resolution and collapse of the resist pattern after development are caused. Thus, a decrease in film thickness of a resist is desired. However, it is difficult to obtain a resist pattern film thickness sufficient for substrate processing. Further, a process for imparting a function of a mask used during substrate processing to not only the resist pattern but also a resist underlayer film to be formed between a resist and a semiconductor substrate to be processed is required. As a resist underlayer film for such a process, a resist underlayer film for lithography having a selection ratio of dry etching rate close to that of a resist, which is different from a conventional resist underlayer film having a high etching rate, a resist underlayer film for lithography having a lower selection ratio of dry etching rate than that of a resist, and a resist underlayer film for lithography having a lower selection ratio of dry etching rate than that of a semiconductor substrate are required. To such resist underlayer films, an anti-reflective performance may be imparted. Alternatively, the resist underlayer films may have a function of a conventional anti-reflective coating.

On the other hand, in order to obtain a finer resist pattern, a process for making a resist pattern and a resist underlayer film finer than the pattern width during development of the resist by dry etching of the resist underlayer film is beginning to be used. As the resist underlayer film for such a process, a resist underlayer film having a selection ratio of dry etching rate close to that of a resist, which is different from a conventional anti-reflective coating having a high etching rate, is required. To such a resist underlayer film, an anti-reflective performance may be imparted. Alternatively, the resist underlayer film may have a function of a conventional anti-reflective coating.

In the present invention, the resist underlayer film of the present invention may be formed on a substrate and a resist may be applied directly to the resist underlayer film, or if necessary, one or more layers of coating material may be formed on the resist underlayer film and a resist may be applied to the layers. In this case, even when the resist is thinly applied to prevent pattern collapse due to a decrease in pattern width of the resist, the substrate can be processed by appropriate selection of etching gas.

Specifically, the semiconductor device can be manufactured through steps of forming the resist underlayer film on a semiconductor substrate from the resist underlayer film-forming composition, forming a hard mask from a coating material containing a silicon component or the like on the resist underlayer film or a hard mask (e.g., from silicon nitride oxide) by vapor deposition, forming a resist film on the hard mask, irradiating the resist film with light or an electron beam, followed by development to form a resist pattern, etching the hard mask through the resist pattern with a halogen-based gas, etching the resist underlayer film through the patterned hard mask with an oxygen-based gas or a hydrogen-based gas, and processing the semiconductor substrate through the patterned resist underlayer film with a halogen-based gas.

In consideration of effect of anti-reflective coating, a diffused substance is not generated in the photoresist during heating and drying due to a light absorption moiety incorporated in the skeleton. The light absorption moiety has sufficiently high light absorption performance. Accordingly, the resist underlayer film-forming composition for lithography in the present invention has high anti-reflective effect.

The resist underlayer film-forming composition for lithography in the present invention has high thermal stability, can prevent contamination of a top-layer film by a decomposed substance during baking, and can impart a temperature margin in a baking step.

A material for a resist underlayer film for lithography in the present invention can be used for a film having a function of preventing reflection of light depending on a process condition, and a function of preventing an interaction between the substrate and the photoresist or a bad influence on the substrate of a substance produced during exposure to a material used for the photoresist or the photoresist.

EXAMPLES (Synthesis of Resin 1)

In a three-neck flask, 50.0 g of 1,1,1-tris(4-hydroxyphenyl)ethane (available from Tokyo Chemical Industry Co., Ltd.), 35.6 g of 4,4-difluorobenzophenone (available from Tokyo Chemical Industry Co., Ltd.), 31.37 g of potassium carbonate (available from Wako Pure Chemical Industries, Ltd.), and 272.9 g of N-methylpyrrolidone (available from KANTO CHEMICAL CO., INC.) were placed. The mixture was then heated to 150° C. and stirred for about 2.5 hours. After completion of a reaction, the mixture was diluted with 180.8 g of N-methylpyrrolidone, and potassium carbonate was removed by filtration. To the obtained filtrate, 1N-HCl was added to make the pH neutral, and the mixture was then stirred for some time. This dilute solution was added dropwise to a solution of methanol/water (90/10 (vol/vol)), resulting in reprecipitation. The obtained precipitate was filtered by suction, and the filtered product was dried at 60° C. overnight under reduced pressure. As a result, 54.8 g of a resin 1 was obtained. The resulting polymer corresponded to Formula (2-1). The weight average molecular weight Mw measured by GPC in terms of polystyrene was 2,900.

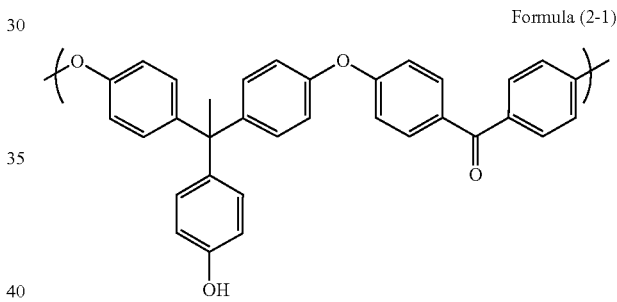

Formula (2-1)

(Synthesis of Resin 2)

In a three-neck flask, 30.0 g of TEP-DF (available from ASAHI YUKIZAI CORPORATION), 16.43 g of 4,4-difluorobenzophenone (available from Tokyo Chemical Industry Co., Ltd.), 14.47 g of potassium carbonate (available from Wako Pure Chemical Industries, Ltd.), and 142.1 g of N-methylpyrrolidone (available from KANTO CHEMICAL CO., INC.) were placed. The mixture was then heated to 150° C. and stirred for about 4 hours. After completion of a reaction, the mixture was diluted with 261.1 g of N-methylpyrrolidone, and potassium carbonate was removed by filtration. To the obtained filtrate, 1N-HCl was added to make the pH neutral, and the mixture was then stirred for some time. This dilute solution was added dropwise to a solution of methanol/water (90/10 (vol/vol)), resulting in reprecipitation. The obtained precipitate was filtered by suction, and the filtered product was dried at 60° C. overnight under reduced pressure. As a result, 29.1 g of a resin 2 was obtained. The resulting polymer corresponded to Formula (2-2). The weight average molecular weight Mw measured by GPC in terms of polystyrene was 2,900.

Formula (2-2)

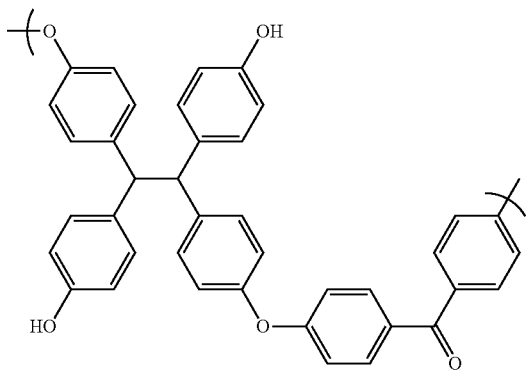

(Synthesis of Resin 3)

In a three-neck flask, 30.0 g of TEP-TPA (available from ASAHI YUKIZAI CORPORATION), 13.81 g of 4,4-difluorobenzophenone (available from Tokyo Chemical Industry Co., Ltd.), 12.16 g of potassium carbonate (available from Wako Pure Chemical Industries, Ltd.), and 130.61 g of N-methylpyrrolidone (available from KANTO CHEMICAL CO., INC.) were placed. The mixture was then heated to 150° C. and stirred for about 4 hours. After completion of a reaction, the mixture was diluted with 252.3 g of N-methylpyrrolidone, and potassium carbonate was removed by filtration. To the obtained filtrate, 1N-HCl was added to make the pH neutral, and the mixture was then stirred for some time. This dilute solution was added dropwise to a solution of methanol/water (90/10 (vol/vol)), resulting in reprecipitation. The obtained precipitate was filtered by suction, and the filtered product was dried at 60° C. overnight under reduced pressure. As a result, 18.6 g of a resin 3 was obtained. The resulting polymer corresponded to Formula (2-3). The weight average molecular weight Mw measured by GPC in terms of polystyrene was 3,400.

Formula (2-3)

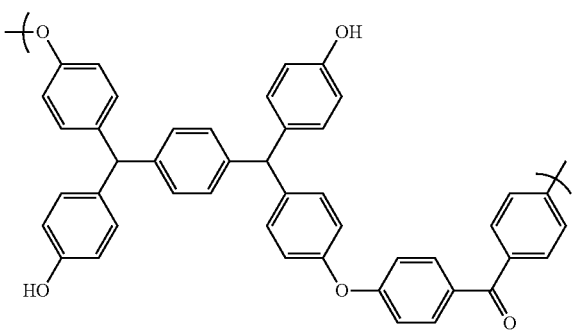

Synthesis Example 1

In an eggplant-shaped flask, 5.00 g of the resin 1, 3.54 g of allyl glycidyl ether (available from Tokyo Chemical Industry Co., Ltd.), 0.02 g of hydroquinone (available from Tokyo Chemical Industry Co., Ltd.), 0.58 g of ethyltriphenylphosphonium bromide (available from HOKKO CHEMICAL INDUSTRY CO., LTD.), 9.17 g of N-methylpyrrolidone (available from KANTO CHEMICAL CO., INC.), and 21.4 g of propylene glycol monomethyl ether acetate were placed. The mixture was then heated to 100° C. and stirred for about 24 hours.

After completion of a reaction, the mixture was diluted with 5.96 g of N-methylpyrrolidone, and added dropwise to a solution of methanol/water (90/10 (vol/vol)), resulting in reprecipitation. The obtained precipitate was filtered by suction, and the filtered product was dried at 60° C. overnight under reduced pressure. As a result, 3.37 g of the resin 2 was obtained. The resulting polymer corresponded to Formula (1-4-1). The weight average molecular weight Mw measured by GPC in terms of polystyrene was 3,700.

Synthesis Example 2

In an eggplant-shaped flask, 5.00 g of the resin 1, 7.34 g of glycidyl methacrylate (available from Tokyo Chemical Industry Co., Ltd.), 0.03 g of hydroquinone (available from Tokyo Chemical Industry Co., Ltd.), 0.96 g of ethyltriphenylphosphonium bromide (available from HOKKO CHEMICAL INDUSTRY CO., LTD.), 9.33 g of N-methylpyrrolidone (available from KANTO CHEMICAL CO., INC.), and 21.8 g of propylene glycol monomethyl ether acetate were placed. The mixture was then heated to 100° C. and stirred for about 18 hours.

After completion of a reaction, the mixture was diluted with 22.2 g of N-methylpyrrolidone, and added dropwise to a solution of methanol/water (90/10 (vol/vol)), resulting in reprecipitation. The obtained precipitate was filtered by suction, and the filtered product was dried at 60° C. overnight under reduced pressure. As a result, 4.85 g of the resin 3 was obtained. The resulting polymer corresponded to Formula (1-4-2). The weight average molecular weight Mw measured by GPC in terms of polystyrene was 3,900.

Synthesis Example 3

In an eggplant-shaped flask, 5.00 g of the resin 1, 5.00 g of allyl bromide (available from Tokyo Chemical Industry Co., Ltd.), 3.97 g of potassium carbonate (available from Wako Pure Chemical Industries, Ltd.), and 20.59 g of N-methylpyrrolidone (available from KANTO CHEMICAL CO., INC.) were placed. The mixture was then heated to 100° C. and stirred for about 24 hours.

After completion of a reaction, the mixture was diluted with 15.1 g of N-methylpyrrolidone, and potassium carbonate was removed by filtration. To the obtained filtrate, 1N-HCl was added to make the pH neutral, and the mixture was then stirred for some time. This dilute solution was added dropwise to a solution of methanol/water (90/10 (vol/vol)), resulting in reprecipitation. The obtained precipitate was filtered by suction, and the filtered product was dried at 60° C. overnight under reduced pressure. As a result, 4.00 g of a resin 4 was obtained. The resulting polymer corresponded to Formula (1-4-3). The weight average molecular weight Mw measured by GPC in terms of polystyrene was 3,100.

Synthesis Example 4

In an eggplant-shaped flask, 10.00 g of the resin 2, 12.68 g of glycidyl methacrylate (available from Tokyo Chemical Industry Co., Ltd.), 0.05 g of hydroquinone (available from Tokyo Chemical Industry Co., Ltd.), 1.16 g of ethyltriphenylphosphonium bromide (available from HOKKO CHEMICAL INDUSTRY CO., LTD.), 17.07 g of N-methylpyrrolidone (available from KANTO CHEMICAL CO., INC.), and 39.84 g of propylene glycol monomethyl ether acetate were placed. The mixture was then heated to 100° C. and stirred for about 12 hours.

After completion of a reaction, the mixture was diluted with 40.0 g of N-methylpyrrolidone, and added dropwise to a methanol solution, resulting in reprecipitation. The obtained precipitate was filtered by suction, and the filtered product was dried at 60° C. overnight under reduced pressure. As a result, 15.02 g of a resin 5 was obtained. The resulting polymer corresponded to Formula (1-4-11). The weight average molecular weight Mw measured by GPC in terms of polystyrene was 7,400.

Synthesis Example 5

In an eggplant-shaped flask, 10.00 g of the resin 3, 11.24 g of glycidyl methacrylate (available from Tokyo Chemical Industry Co., Ltd.), 0.04 g of hydroquinone (available from Tokyo Chemical Industry Co., Ltd.), 1.47 g of ethyltriphenylphosphonium bromide (available from HOKKO CHEMICAL INDUSTRY CO., LTD.), 15.93 g of N-methylpyrrolidone (available from KANTO CHEMICAL CO., INC.), and 37.16 g of propylene glycol monomethyl ether acetate were placed. The mixture was then heated to 100° C. and stirred for about 12 hours.

After completion of a reaction, the mixture was diluted with 37.6 g of N-methylpyrrolidone, and added dropwise to a methanol solution, resulting in reprecipitation. The obtained precipitate was filtered by suction, and the filtered product was dried at 60° C. overnight under reduced pressure. As a result, 13.12 g of a resin 6 was obtained. The resulting polymer corresponded to Formula (1-4-12). The weight average molecular weight Mw measured by GPC in terms of polystyrene was 5,200.

Comparative Synthesis Example 1

The resin 1 was prepared as a resin in Comparative Synthesis Example 1.

Comparative Synthesis Example 2

34.91 g of propylene glycol monomethyl ether was added to 10.00 g of epoxy group-containing benzene fused ring compound (trade name: EPICLON HP-4700, epoxy value: 165 g/eq., available from DIC Corporation), 4.37 g of acrylic acid, 0.56 g of ethyltriphenylphosphonium bromide, and 0.03 g of hydroquinone, and the mixture was heated and stirred under a nitrogen atmosphere at 100° C. for 21 hours. To the obtained solution, 15 g of cation exchange resin (trade name: DOWEX [registered trademark]550A, Muromachi Technos Co., Ltd.) and 15 g of anion exchange resin (trade name: AMBERLITE [registered trademark] 15JWET, ORGANO CORPORATION) were added, and the mixture was subjected to an ion exchange treatment at room temperature for 4 hours. The ion-exchange resins were separated, and a solution of compound was obtained. The obtained compound corresponded to Formula (2-2), and the weight average molecular weight Mw measured by GPC in terms of polystyrene was 1,400.

Formula (2-2)

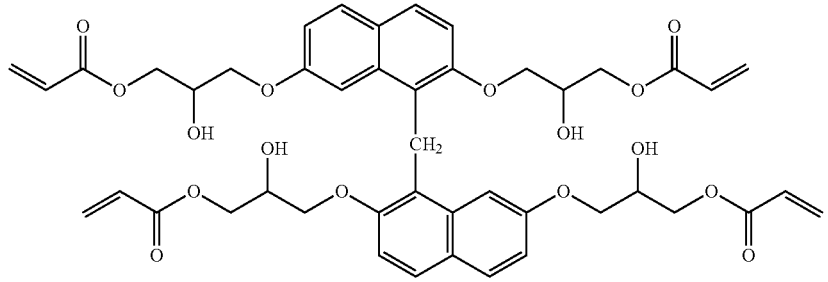

Example 1

The resin obtained in Synthesis Example 1 was dissolved in propylene glycol monomethyl ether acetate, and the mixture was subjected to ion exchange, to obtain a resin solution (solid content: 20.60% by mass). To 2.50 g of this resin solution, 0.05 g of propylene glycol monomethyl ether acetate containing 1% by mass surfactant (trade name: MEGAFACE R-40 available from DIC Corporation) and 2.60 g of propylene glycol monomethyl ether acetate were added. The mixture was filtered through a polytetrafluoroethylene microfilter having a pore diameter of 0.1 μm, to prepare a solution of a resist underlayer film-forming composition.

Example 2

The resin obtained in Synthesis Example 2 was dissolved in propylene glycol monomethyl ether acetate, and the mixture was subjected to ion exchange, to obtain a resin solution (solid content: 18.67% by mass). To 2.80 g of this resin solution, 0.05 g of propylene glycol monomethyl ether acetate containing 1% by mass surfactant (trade name: MEGAFACE R-40 available from DIC Corporation) and 2.38 g of propylene glycol monomethyl ether acetate were added. The mixture was filtered through a polytetrafluoroethylene microfilter having a pore diameter of 0.1 μm, to prepare a solution of a resist underlayer film-forming composition.

Example 3

The resin obtained in Synthesis Example 3 was dissolved in propylene glycol monomethyl ether acetate, and the mixture was subjected to ion exchange, to obtain a resin solution (solid content: 20.00% by mass). To 2.00 g of this resin solution, 0.04 g of propylene glycol monomethyl ether acetate containing 1% by mass surfactant (trade name: MEGAFACE R-40 available from DIC Corporation) and 1.97 g of propylene glycol monomethyl ether acetate were added. The mixture was filtered through a polytetrafluoroethylene microfilter having a pore diameter of 0.1 μm, to prepare a solution of a resist underlayer film-forming composition.

Example 4

The resin obtained in Synthesis Example 4 was dissolved in propylene glycol monomethyl ether acetate, and the mixture was subjected to ion exchange, to obtain a resin solution (solid content: 130.65% by mass). To 5.85 g of this resin solution, 0.16 g of propylene glycol monomethyl ether acetate containing 1% by mass surfactant (trade name: MEGAFACE R-40 available from DIC Corporation) and 3.99 g of propylene glycol monomethyl ether acetate were added. The mixture was filtered through a polytetrafluoroethylene microfilter having a pore diameter of 0.1 μm, to prepare a solution of resist underlayer film-forming composition.

Example 5

The resin obtained in Synthesis Example 5 was dissolved in propylene glycol monomethyl ether acetate, and the mixture was subjected to ion exchange, to obtain a resin solution (solid content: 18.53% by mass). To 4.31 g of this resin solution, 0.16 g of propylene glycol monomethyl ether acetate containing 1% by mass surfactant (trade name: MEGAFACE R-40 available from DIC Corporation) and 5.53 g of propylene glycol monomethyl ether acetate were added. The mixture was filtered through a polytetrafluoroethylene microfilter having a pore diameter of 0.1 μm, to prepare a solution of a resist underlayer film-forming composition.

Comparative Example 1

The resin obtained in Comparative Synthesis Example 1 was dissolved in propylene glycol monomethyl ether acetate, and the mixture was subjected to ion exchange, to obtain a resin solution (solid content: 160.94% by mass). To 3.00 g of this resin solution, 0.06 g of propylene glycol monomethyl ether acetate containing 1% by mass surfactant (trade name: MEGAFACE R-40 available from DIC Corporation) and 2.04 g of propylene glycol monomethyl ether acetate were added. The mixture was filtered through a polytetrafluoroethylene microfilter having a pore diameter of 0.1 μm, to prepare a solution of a resist underlayer film-forming composition.

Comparative Example 2

To 4.19 g of the resin solution (solid content: 25.02% by mass) obtained in Comparative Synthesis Example 2, 0.001 g of surfactant (trade name: MEGAFACE R-40 available from DIC Corporation), 6.62 g of propylene glycol monomethyl ether, and 4.19 g of propylene glycol monomethyl ether acetate were added to prepare a solution of a resist underlayer film-forming composition.

(Photo-Curing Test)

The resist underlayer film-forming composition prepared in each of Examples 1 to 5 and Comparative Examples 1 and 2 was applied (by spin coating) to a silicon wafer using a spinner. The composition was heated on a hot plate at 215° C. for one minute to form a coating film with a thickness of about 200 nm (resist underlayer film). This resist underlayer film-coating film was irradiated with ultraviolet light of 500 mJ/cm$^2$ with an ultraviolet irradiation device using a UV irradiation unit (wavelength: 172 nm) manufactured by USHIO INC. Solvent separation under irradiation with light (irradiation with ultraviolet light) was confirmed. For the solvent separation, the coated film after irradiation with ultraviolet light was immersed in a mixed solvent of propylene glycol monomethyl ether and propylene glycol monomethyl ether acetate at a ratio of 7:3 for one minute, spin-dried, and then baked at 100° C. for one minute, and the film thickness was measured. The shrinkage ratio of the film before and after irradiation with light was also calculated (results in Table 1).

TABLE 1

Evaluation of photocuring properties of resist underlayer film

| | Baking temperature (° C.) | Initial film thickness (Å) | Film thickness after irradiation with light (Å) | Film thickness after solution separation (Å) | Shrinkage ratio of film before and after irradiation with light (%) |
|---|---|---|---|---|---|
| Example 1 | 215 | 1995 | 1983 | 1979 | 0.6 |
| Example 2 | 215 | 2059 | 2039 | 2034 | 1.0 |
| Example 3 | 215 | 1923 | 1921 | 1915 | 0 |
| Example 4 | 215 | 1972 | 1956 | 1950 | 0.8 |
| Example 5 | 215 | 2017 | 2003 | 2005 | 0.7 |
| Comparative Example 1 | 215 | 2111 | 2108 | 50 or less | 0.1 |
| Comparative Example 2 | 215 | 2026 | 1983 | 1975 | 2.1 |

(Measurement of Optical Constant)

The solution of the resist underlayer film-forming composition prepared in each of Examples 1 to 5 and Comparative Examples 1 and 2 was applied to a silicon wafer by a spin coater, and then baked on a hot plate at 215° C. for one minute to form a resist underlayer film (thickness: 0.05 μm). The refractive index (n value) and the light absorption coefficient (k value, also referred to as extinction coefficient) of the resist underlayer films were measured at a wavelength of 193 nm and 248 nm using a spectroscopic ellipsometer (results in Table 2). The resist underlayer film-coating films were each irradiated with ultraviolet light of 500 mJ/cm$^2$ with an ultraviolet irradiation device using a UV irradiation unit (wavelength: 172 nm) manufactured by USHIO INC. The refractive index and the light absorption coefficient at a wavelength of 193 nm and 248 nm after irradiation with light (irradiation with ultraviolet light) were measured (results in Table 3).

TABLE 2

Refractive index n and light absorption coefficient k before irradiation with light

| | Baking temperature ° C. | Before irradiation with light n/k 193 nm | Before irradiation with light n/k 248 nm |
|---|---|---|---|
| Example 1 | 215 | 1.56/0.76 | 1.87/0.16 |
| Example 2 | 215 | 1.54/0.69 | 1.85/0.14 |
| Example 3 | 215 | 1.57/0.77 | 1.89/0.16 |
| Example 4 | 215 | 1.55/0.68 | 1.85/0.16 |
| Example 5 | 215 | 1.54/0.70 | 1.84/0.15 |
| Comparative Example 1 | 215 | 1.55/0.85 | 1.89/0.18 |
| Comparative Example 2 | 215 | 1.49/0.29 | 2.01/0.43 |

TABLE 3

Refractive index n and light absorption coefficient k after irradiation with light

| | Baking temperature ° C. | After irradiation with light n/k 193 nm | After irradiation with light n/k 248 nm |
|---|---|---|---|
| Example 1 | 215 | 1.54/0.77 | 1.89/0.18 |
| Example 2 | 215 | 1.55/0.70 | 1.86/0.16 |
| Example 3 | 215 | 1.54/0.77 | 1.89/0.18 |
| Example 4 | 215 | 1.56/0.69 | 1.86/0.16 |
| Example 5 | 215 | 1.55/0.69 | 1.85/0.16 |
| Comparative Example 1 | 215 | 1.55/0.83 | 1.89/0.18 |
| Comparative Example 2 | 215 | 1.55/0.15 | 1.95/0.45 |

(Measurement of Dry Etching Rate)

As an etcher and an etching gas used in measurement of dry etching rate, the following etcher and gas were used.
RIE-10NR (available from SAMCO INC.): $CF_4$ The solution of the resist underlayer film-forming composition prepared in each of Examples 1 to 5 and Comparative Examples 1 and 2 was applied to a silicon wafer by a spin coater, and then baked on a hot plate at 215° C. for one minute to form a resist underlayer film (thickness: 0.20 µm). The dry etching rate was measured using a $CF_4$ gas as an etching gas. The dry etching rates of the resist underlayer films in Examples 1 to 3 and Comparative Examples 1 and 2 were compared with each other. The resist underlayer film-coating films were each irradiated with ultraviolet light of 500 mJ/cm² with an ultraviolet irradiation device using a UV irradiation unit (wavelength: 172 nm) manufactured by USHIO INC. The dry etching rates of the resist underlayer films in Examples 1 to 3 and Comparative Examples 1 and 2 were compared with each other. The results are shown in Table 4. The dry etching rate ratio is a ratio of the dry etching rate of a resist underlayer film to the dry etching rate of a KrF photoresist (results in Table 4).

TABLE 4

Dry etching rate ratio

| | | Before irradiation with light | After irradiation with light |
|---|---|---|---|
| Example 1 | Rate ratio of film baked at 215° C. | 0.97 | 0.96 |
| Example 2 | Rate ratio of film baked at 215° C. | 1.01 | 0.98 |
| Example 3 | Rate ratio of film baked at 215° C. | 0.95 | 0.89 |
| Example 4 | Rate ratio of film baked at 215° C. | 0.98 | 0.97 |
| Example 5 | Rate ratio of film baked at 215° C. | 0.96 | 0.95 |
| Comparative Example 1 | Rate ratio of film baked at 215° C. | 0.94 | 0.95 |
| Comparative Example 2 | Rate ratio of film baked at 215° C. | 1.27 | 1.26 |

(Heat Resistance Test of Resist Underlayer Film)

The solution of the resist underlayer film-forming composition prepared in each of Examples 1 to 5 and Comparative Examples 1 and 2 was applied to a silicon wafer using a spin coater, and baked on a hot plate at 215° C. for 60 seconds, to form a resist underlayer film (thickness: 0.20 µm). The resist underlayer film-coating films were each irradiated with ultraviolet light of 500 mJ/cm² with an ultraviolet irradiation device using a UV irradiation unit (wavelength: 172 nm) manufactured by USHIO INC. The obtained film was heated by increasing the temperature from room temperature (about 20° C.) at a rate of 10° C. per minute, and subjected to thermogravimetric analysis in air. The change in weight decrease with time was monitored. The results are shown in Table 5.

TABLE 5

Temperature during 5% weight decrease of resist underlayer film

| | Baking temperature | Temperature during 5% weight decrease before irradiation with light (° C.) | Temperature during 5% weight decrease after irradiation with light (° C.) |
|---|---|---|---|
| Example 1 | 215° C. | 377 | 371 |
| Example 2 | 215° C. | 396 | 372 |
| Example 3 | 215° C. | 438 | 426 |
| Example 4 | 215° C. | 366 | 355 |
| Example 5 | 215° C. | 382 | 377 |
| Comparative Example 1 | 215° C. | 372 | 378 |
| Comparative Example 2 | 215° C. | 363 | 253 |

(Test of Coating Stepped Substrate)

For evaluation of step-coating properties, the thicknesses of coating film at a dense pattern area (DENSE) with a trench width of 50 nm and a pitch of 100 nm and an open area (OPEN) having no pattern of a $SiO_2$ substrate with a thickness of 200 nm were compared. The resist underlayer film-forming composition in each of Examples 1 to 3 and Comparative Examples 1 to 2 was applied to the substrate, and baked at 215° C. for 60 seconds, to form a resist underlayer film. The resist underlayer film-forming composition was prepared so that the film thickness on a solid substrate was 150 nm. The step-coating properties of the substrate were observed with a scanning electron microscope (S-4800) manufactured by Hitachi High-Technologies Corporation, and the difference between the film thickness at the dense area (pattern part) and the film thickness at the open area (unpatterned part) (difference in level of coating between the dense area and the open area, referred to as Bias) was measured. Thus, the flattening properties were evaluated. Herein, the flattening properties mean that the difference (Iso-dense bias) in film thickness of a material applied at a portion where a pattern exists (dense area (patterned portion)) and a portion where a pattern does not exist (open area (unpatterned portion)) is small (results in Table 6).

TABLE 6

Flattening properties of resist underlayer film

| | DENSE thickness (nm) | OPEN thickness (nm) | DENSE/OPEN difference in level of coating (nm) |
|---|---|---|---|
| Example 1 | 70 | 119 | 49 |
| Example 2 | 77 | 120 | 43 |
| Example 3 | 71 | 107 | 36 |
| Example 4 | 82 | 117 | 45 |

TABLE 6-continued

| | Flattening properties of resist underlayer film | | |
|---|---|---|---|
| | DENSE thickness (nm) | OPEN thickness (nm) | DENSE/OPEN difference in level of coating (nm) |
| Example 5 | 76 | 128 | 52 |
| Comparative Example 1 | 73 | 137 | 64 |

INDUSTRIAL APPLICABILITY

As a photocurable composition for coating a stepped substrate of the present invention of the present application, a stepped substrate-coating composition having high properties of filling a pattern and capable of forming on a substrate a coating film that can be formed by photocuring without occurrence of degassing and thermal shrinkage, has flattening properties, and has high heat resistance after irradiation with light is provided.

The invention claimed is:

1. A photocurable composition for coating a stepped substrate, the photocurable composition containing a polymer containing a unit structure of Formula (1):

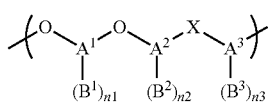

Formula (1)

[wherein $A^1$, $A^2$, and $A^3$ are each independently an aromatic $C_{6-100}$ ring optionally containing a heteroatom or a hydrocarbon group containing an aromatic $C_{6-100}$ ring optionally containing a heteroatom, $B^1$, $B^2$, and $B^3$ are each independently Formula (2):

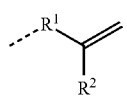

Formula (2)

(wherein $R^1$ is a $C_{1-10}$ alkylene group, a $C_{1-10}$ alkenylene group, a $C_{1-10}$ alkynylene group, a $C_{6-40}$ arylene group (the alkylene group, the alkenylene group, the alkynylene group, and the arylene group are optionally substituted with one or two or more cyano groups and/or one or two or more hydroxyl groups), an oxygen atom, a carbonyl group, a sulfur atom, —C(O)—O—, —C(O)—$NR^a$—, —$NR^b$—, or a group including a combination thereof, $R^a$ is a hydrogen atom or a $C_{1-10}$ alkyl group, $R^b$ is a hydrogen atom, a $C_{1-10}$ alkyl group, or a $C_{2-10}$ alkylcarbonyl group, $R^2$ is a hydrogen atom or a $C_{1-10}$ alkyl group, and a dotted line is a bond with $A^1$, $A^2$, or $A^3$), X is a carbonyl group, a sulfonyl group, a —$CR^2_2$— group, or a —$C(CF_3)_2$—group, n1 is an integer of 1 or more and 4 or less, n2 is an integer of 0 or more and 4 or less, n3 is an integer of 0 or more and 4 or less, and n1+n2+n3 is an integer of 1 to 12].

2. The photocurable composition for coating a stepped substrate according to claim 1, wherein $A^1$ is a polynuclear phenol of Formula (1-1) or (1-2):

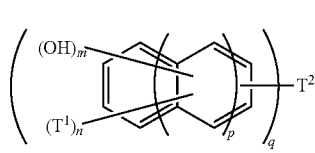

Formula (1-1)

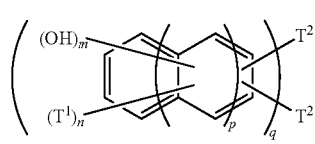

Formula (1-2)

(in Formulae (1-1) and (1-2), $T^1$s are each independently a halogen group, a $C_{1-10}$ alkyl group, a $C_{6-18}$ aryl group, a $C_{7-28}$ arylalkyl group, a $C_{2-10}$ alkylcarbonyl group, a $C_{2-10}$ alkylcarbonyloxy group, a $C_{2-10}$ alkylcarbonylamino group, a $C_{7-28}$ aryloxyalkyl group, a $C_{1-6}$ alkoxy group, or an organic group including a combination thereof, q is an integer of 2 to 6, when q is 2, $T^2$ is a single bond or a divalent $C_{1-10}$ hydrocarbon group optionally having a hydroxyl group or a divalent $C_{7-28}$ arylalkyl group optionally having a hydroxyl group, or when q is 3 to 6, $T^2$ is a trivalent to hexavalent $C_{1-10}$ hydrocarbon group optionally having a hydroxyl group or a trivalent to hexavalent $C_{7-28}$ arylalkyl group optionally having a hydroxyl group, m is an integer of 1 to 7, n is an integer of 0 or more and 7-m or less, two $T^2$s in Formula (1-2) optionally form a ring together, and p is an integer of 0 or 1), in which two hydroxyl groups among m×q hydroxyl groups are replaced by two bonds between $A^1$ and two O atoms, and the rest of the m×q hydroxyl groups and/or a hydrogen atom in $T^2$ are replaced by bonds between $A^1$ and $B^1$, provided that the total number of the bonds with $B^1$ is n1.

3. The photocurable composition for coating a stepped substrate according to claim 1, wherein $A^1$ is a group derived from tri(hydroxyphenyl)methane, a group derived from tetrakis(hydroxyphenyl)ethane, or a group derived from tetrakis(hydroxyphenyl)-p-xylene, and $A^2$ and $A^3$ are a group derived from a benzene ring or a naphthalene ring.

4. The photocurable composition for coating a stepped substrate according to claim 1, wherein X is a carbonyl group.

5. The photocurable composition for coating a stepped substrate according to claim 1, wherein the photocurable composition is a polymer containing the unit structure of Formula (1), wherein n1 is 1 or 2 and n2 and n3 are 0.

6. The photocurable composition for coating a stepped substrate according to claim 1, wherein the polymer containing the unit structure of Formula (1) further contains a unit structure of Formula (3):

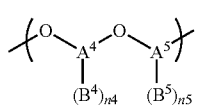

Formula (3)

(wherein $A^4$ and $A^5$ are each an aromatic $C_{6-48}$ ring optionally containing a heteroatom or a hydrocarbon group containing an aromatic $C_{6-48}$ ring optionally containing a heteroatom, $B^4$ and $B^5$ are the same groups as $B^1$, $B^2$, and $B^3$ in Formula (2) described above, n4 is an integer of 1 or more and 4 or less, n5 is an integer of 0 or more and 4 or less, and n4+n5 is an integer of 1 to 8).

7. The photocurable composition for coating a stepped substrate according to claim 1, wherein the polymer containing the unit structure of Formula (1) or the unit structures of Formulae (1) and (3) further contains a unit structure of Formula (1'), wherein in Formula (1), n1 is 0, n2 is 0, and n3 is 0.

8. The photocurable composition for coating a stepped substrate according to claim 1, which is a resist underlayer film-forming composition used in a lithography process in manufacturing of a semiconductor device.

9. A method for manufacturing a coating substrate comprising a step (i) of applying the photocurable composition for coating a stepped substrate according to claim 1 to a stepped substrate, and a step (ii) of exposing the photocurable composition for coating a stepped substrate.

10. The method for manufacturing a coating substrate according to claim 9, further comprising a step (ia) of heating the substrate at a temperature of 70 to 400° C. for 10 seconds to 5 minutes after the photocurable composition for coating a stepped substrate is applied in the step (i).

11. The method for manufacturing a coating substrate according to claim 9, wherein a wavelength of exposure light in the step (ii) is 150 nm to 248 nm.

12. The method for manufacturing a coating substrate according to claim 9, wherein an exposure dose in the step (ii) is 10 mJ/cm$^2$ to 3,000 mJ/cm$^2$.

13. The method for manufacturing a coating substrate according to claim 9, wherein the substrate has an open area (unpatterned area) and a pattern area including dense (DENCE) and crude (ISO) patterns, and an aspect ratio of the patterns is 0.1 to 10.

14. The method for manufacturing a coating substrate according to claim 13, wherein a difference in level of coating (Bias) between the open area and the pattern area is 1 to 50 nm.

15. A method for manufacturing a semiconductor device comprising the steps of forming an underlayer film from the composition for coating a stepped substrate according to claim 1 on a stepped substrate, forming a resist film on the underlayer film, irradiating the resist film with light or an electron beam, followed by development, to form a resist pattern, etching the underlayer film through the resist pattern, and processing a semiconductor substrate through the patterned underlayer film.

16. A method for manufacturing a semiconductor device comprising the steps of forming an underlayer film from the photocurable composition for coating a stepped substrate according to claim 1 on a stepped substrate, forming a hard mask on the underlayer film, forming a resist film on the hard mask, irradiating the resist film with light or an electron beam, followed by development, to form a resist pattern, etching the hard mask through the resist pattern, etching the underlayer film through the patterned hard mask, and processing a semiconductor substrate through the patterned underlayer film.

* * * * *